(12) United States Patent
Saketi

(10) Patent No.: US 11,234,351 B2
(45) Date of Patent: Jan. 25, 2022

(54) DISPLAY FABRICATION MICROASSEMBLY SYSTEM

(71) Applicant: Facebook Technologies, LLC, Menlo Park, CA (US)

(72) Inventor: Pooya Saketi, Cork (IE)

(73) Assignee: FACEBOOK TECHNOLOGIES, LLC, Menlo Park, CA (US)

(*) Notice: Subject to any disclaimer, the term of this patent is extended or adjusted under 35 U.S.C. 154(b) by 278 days.

(21) Appl. No.: 16/421,257

(22) Filed: May 23, 2019

(65) Prior Publication Data

US 2020/0128708 A1 Apr. 23, 2020

Related U.S. Application Data

(60) Provisional application No. 62/747,245, filed on Oct. 18, 2018.

(51) Int. Cl.
*B32B 41/00* (2006.01)
*H05K 13/04* (2006.01)
*H05K 13/08* (2006.01)

(52) U.S. Cl.
CPC ..... *H05K 13/0404* (2013.01); *H05K 13/0469* (2013.01); *H05K 13/0813* (2018.08)

(58) Field of Classification Search
CPC ........... H05K 13/0404; H05K 13/0813; H05K 13/0469; H01L 33/0095; H01L 21/67144; H01L 25/0753; H01L 2933/0033; G02B 27/62
USPC .................... 156/60, 64, 350, 351, 378, 379
See application file for complete search history.

(56) References Cited

U.S. PATENT DOCUMENTS

| | | |
|---|---|---|
| 2017/0015006 A1 | 1/2017 | Higginson et al. |
| 2018/0269234 A1 | 9/2018 | Hughes et al. |
| 2018/0277524 A1 | 9/2018 | Moon et al. |

OTHER PUBLICATIONS

International Application No. PCT/US2019/055523, International Search Report and Written Opinion dated Jan. 28, 2020, 10 pages.

*Primary Examiner* — Michael N Orlando
*Assistant Examiner* — Joshel Rivera
(74) *Attorney, Agent, or Firm* — Weaver Austin Villeneuve & Sampson LLP

(57) ABSTRACT

Embodiments herein address these and other issues by providing a display assembly system with a pick-up tool having 6 degrees of freedom (6DOF) coupled with a pick-up head having an at least partially transparent adhesive element to which light-emitting structures may be adhered for picking and placement during the display manufacture process. Embodiments further include a touchdown sensor coupled with the pick-up tool and pick-up head that allow sensing of a force applied to the pick-up head in an upward direction.

20 Claims, 16 Drawing Sheets

DISPLAY FABRICATION MICROASSEMBLY SYSTEM

CROSS-REFERENCE TO RELATED APPLICATIONS

This application claims the benefit of U.S. Provisional Application No. 62/747,245, filed Oct. 18, 2018, entitled "Display Fabrication Microassembly System" which is incorporated herein by reference in its entirety.

BACKGROUND

Modern electronics such as virtual reality (VR), augmented reality (AR), and/or mixed reality (MR) devices, may include displays with light-emitting diodes (LEDs). One or more of these LEDs may be disposed on light-emitting structures, and displays may comprise light assemblies formed from multiple adjacent light-emitting structures. During manufacture of these displays, light-emitting structures can be physically placed on a backplane using a pick up tool, or fine positioning tool, and subsequently bonded to the backplane.

Traditional display manufacturing techniques have their shortcomings. Display assembly systems often cannot detect or compensate for spatial offsets between light emitters on one side of a light-emitting structure with which a light assembly is comprised and corresponding electrical interconnects on another side of the light-emitting structure. These spatial offsets can result in the electrical interconnects failing to come into any physical contact with a respective backplane contact of a backplane to which the light-emitting structure is bonded. This can result in electrical failure of the corresponding emitters.

SUMMARY

Embodiments herein address these and other issues by providing a display fabrication assembly system with a pick-up tool having 6 degrees of freedom (6DOF) coupled with a pick-up head having an at least partially transparent adhesive element to which light-emitting structures may be adhered for picking and placement during the display manufacturing process. Embodiments further include a touchdown sensor coupled with the pick-up tool and pick-up head that allows sensing of a force applied to the pick-up head in an upward direction.

An example assembly system, according to the disclosure, comprises a pick-up head having an adhesive element disposed on a transparent surface. An adhesiveness of the adhesive element is sufficient to enable the adhesive element to adhere to a light-emitting structure to pick the light-emitting structure from a fabrication substrate and place the light-emitting structure onto a backplane, and he adhesive element is at least partially transparent. The assembly system further comprises a pick-up tool coupled with the pick-up head and configured to position the pick-up head with 6 degrees of freedom (6DOF), and a touchdown sensor coupled with the pick-up tool and pick-up head and configured to sense a force applied to the pick-up head in an upward direction, substantially perpendicular to the transparent surface of the pick-up head.

An example method of display assembly, according to the description, comprises using a pick-up head with a pick-up tool to pick a light-emitting structure from a fabrication substrate and place the light-emitting structure onto a backplane. The pick-up tool is configured to manipulate the pick-up head 6 degrees of freedom (6DOF), and the pick-up head comprises an adhesive element disposed on a transparent surface. Picking the light-emitting structure from the fabrication substrate comprises adhering the adhesive element to the light-emitting structure, and the adhesive element is at least partially transparent. The method further comprises pressing the light-emitting structure to the backplane with the pick-up head during a bonding process in which electrical contacts of the light-emitting structure are bonded to the backplane. A touchdown sensor coupled with the pick-up tool and pick-up head senses a force applied to the pick-up head in an upward direction, substantially perpendicular to the transparent surface of the pick-up head.

An example non-transitory computer-readable medium, according to the description, includes instructions embedded thereon for assembling a display. The instructions, when executed by a computer system, cause the computer system to use a pick-up head with a pick-up tool to pick a light-emitting structure from a fabrication substrate and place the light-emitting structure onto a backplane, where the pick-up tool is configured to manipulate the pick-up head 6 degrees of freedom (6DOF), the pick-up head comprises an adhesive element disposed on a transparent surface, picking the light-emitting structure from the fabrication substrate comprises adhering the adhesive element to the light-emitting structure, and the adhesive element is at least partially transparent. The instructions further cause the computer system to cause the pick-up head to press the light-emitting structure to the backplane during a bonding process in which electrical contacts of the light-emitting structure are bonded to the backplane, where a touchdown sensor coupled with the pick-up tool and pick-up head senses a force applied to the pick-up head in an upward direction, substantially perpendicular to the transparent surface of the pick-up head.

BRIEF DESCRIPTION OF THE DRAWINGS

Illustrative embodiments are described with reference to the following figures.

The figures depict embodiments of the present disclosure for purposes of illustration only. One skilled in the art will readily recognize from the following description that alternative embodiments of the structures and methods illustrated may be employed without departing from the principles of, or benefits touted in, this disclosure. Coordinate frames including two or three mutually orthogonal axes (e.g., XY, XZ, YZ, and/or XYZ axes) have been included in some figures, to help illustrate how components illustrated in these figures may be oriented, relative to other figures.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label. Additionally, where a figure may illustrate multiple components and/or features of the same type, only a portion of the components and/or features may be labeled in some instances, to avoid clutter in the figure.

DETAILED DESCRIPTION

Several illustrative embodiments will now be described with respect to the accompanying drawings, which form a part hereof. While particular embodiments, in which one or more aspects of the disclosure may be implemented, are described below, other embodiments may be used and various modifications may be made without departing from the scope of the disclosure or the spirit of the appended claims.

Embodiments are described herein with reference to the figures, where like reference numbers indicate identical or functionally similar elements. Also in the figures, the left most digit of each reference number corresponds to the figure in which the reference number is first used.

Figures 3A, 3B:
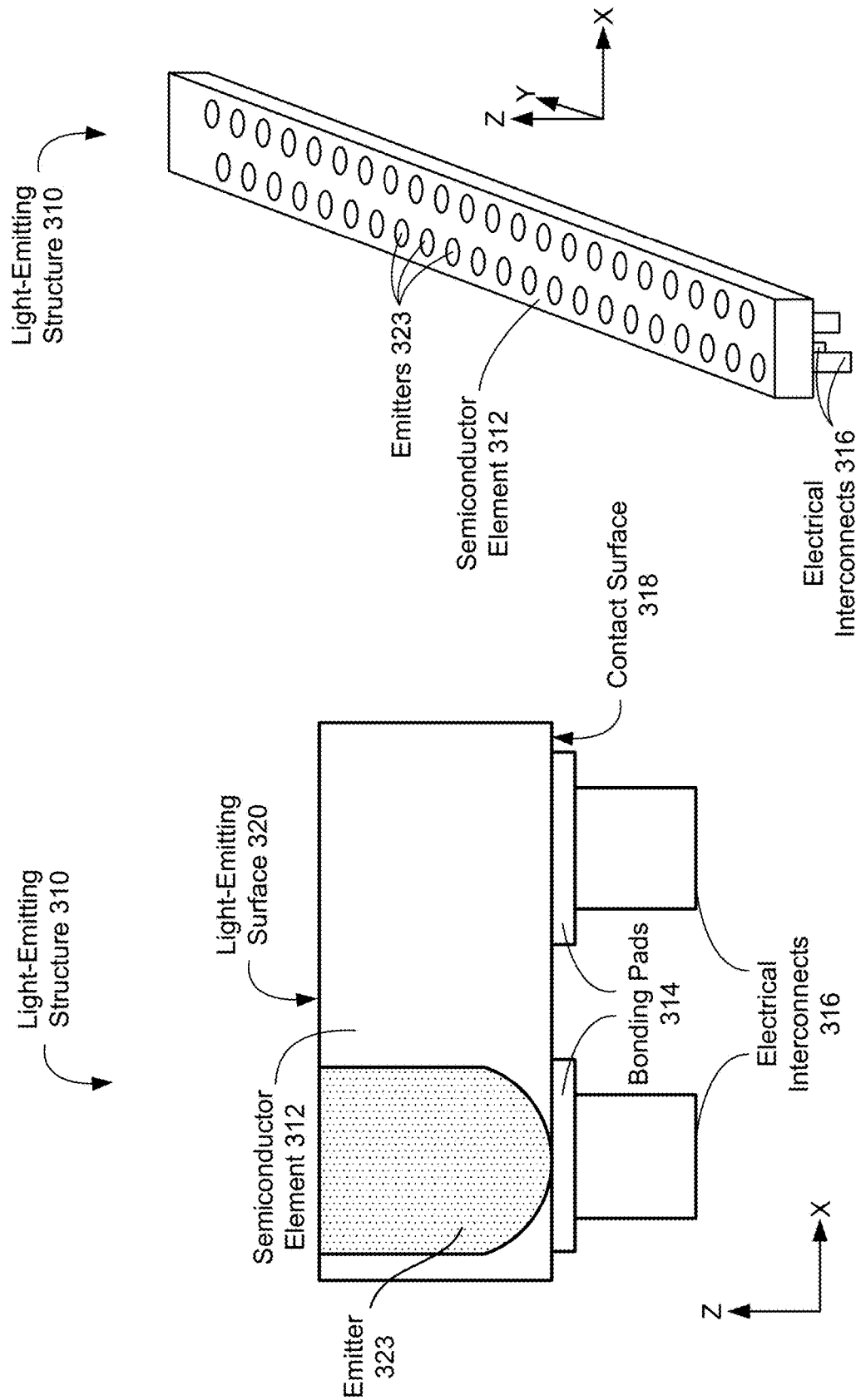
FIG. 3A is a cross-sectional view of a light-emitting structure, in accordance with one embodiment.
FIG. 3B is a perspective view of a light-emitting structure, according to an embodiment.

As used herein, a micro-LED (or "μLED") may refer to an LED that has an active light-emitting area with a linear dimension that is less than 50 μm, less than 20 μm, or less than 10 μm. For example, the linear dimension may be as small as 2 μm or 4 μm. As shown in FIG. 3B and elsewhere, light-emitting structures may comprise multiple micro-LEDs (and/or other emitters).

It is further noted that embodiments herein are generally directed toward a microassembly system. In other words, embodiments are capable of (1) assembling components with features sizes in micron-scale range, (2) assembling mesoscale components with micro-scale precision and accuracy, or (3) both. That said, techniques provided herein may extend to fabrication systems other than microassembly systems.

As previously noted, AR, VR, MR, and other devices, may include displays with micro LEDs. The manufacture of these displays often can be different than the manufacture of larger displays, and may involve a pick-and-place technique for assembling a light assembly which light-emitting structures are placed on, and subsequently bonded to, a display substrate, or backplane. The display can further utilize a mirror to scan the light assembly, steering light emitted from the light assembly to form an image at an output.

Figure 1:
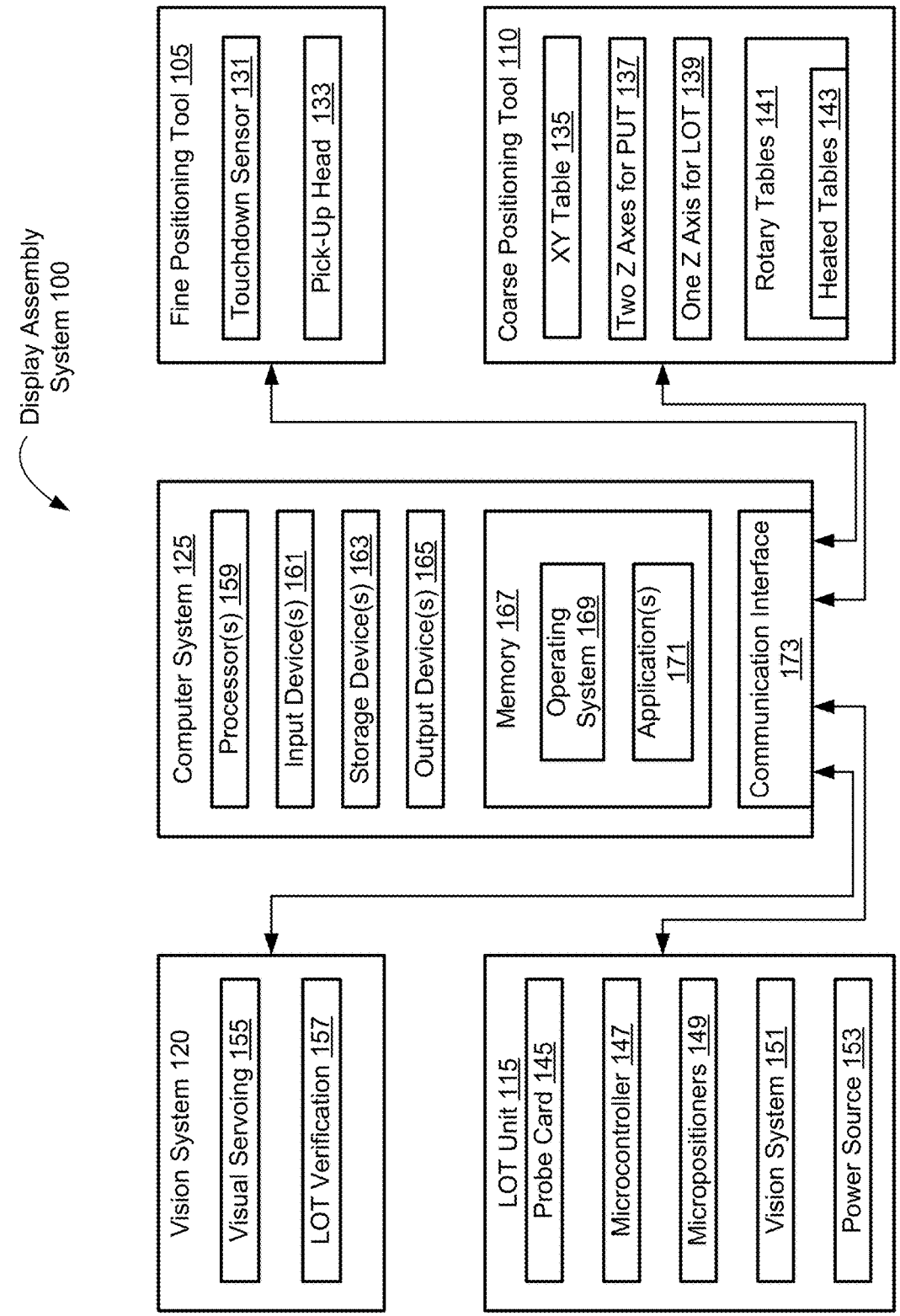
FIG. 1 is a block diagram illustrating various components of a display assembly system, according to some embodiments.

FIG. 1 is a block diagram illustrating various components of a display assembly system 100, according to some embodiments. It will be understood that FIG. 1 is provided as an example. Embodiments are not so limited. For example, alternative embodiments may combine, separate, add, omit, rearrange, or otherwise vary components of the display assembly system 100, depending on desired functionality. The display assembly system 100 may be configured to manufacture a micro-LED display, as described herein.

As illustrated, the display assembly system 100 may comprise a fine positioning tool 105, coarse positioning tool 110, "Lights-On-Test" (LOT) unit 139, and a vision system 120. These various components may communicate with a computer system 125 (communication links are illustrated by double-ended arrows), which may orchestrate the functionality of the various systems and/or communicate with the systems to coordinate display manufacturing.

The fine positioning tool 105 may comprise a touchdown sensor 131, and a pick-up head 133. (As with other components herein, the fine positioning tool 105 may comprise other components not illustrated.) Here, the fine positioning tool 105, also referred to as a "pick-up tool" (PUT) or a "pick-and-place tool," may be capable of taking light-emitting structures from a carrier substrate and placing them onto a backplane to form the light assembly of a display.

To do so, the fine positioning tool 105 may utilize a pick-up head 133. As described in further detail below, the pick-up head 133 may comprise an adhesive portion disposed on a substantially flat surface, configured to adhere to a singulated light-emitting structure and place it on the backplane of a light assembly for the LOT and bonding. In some embodiments, the pick-up head 133 may be detachably coupled with the fine positioning tool 105 using one or more magnets and/or other coupling means.

As described in further detail below, the touchdown sensor 131 can be utilized to help determine the amount of pressure applied to the pick-up head 133. As such, the touchdown sensor 131 can help ensure that the fine positioning tool 105 applies a particular pressure on the light-emitting structure during certain times in manufacturing. This can be particularly useful during the bonding process, in which thermal expansion can cause various components to expand in different ways. The touchdown sensor 131 can then help ensure the fine positioning tool 105 adapts to apply constant pressure, known as a "hold pressure." More particularly, data obtained from the touchdown sensor 131 may be obtained in real time (or near-real time), creating "closed loop" functionality in which the movement of the fine positioning tool 105 can be iterative, based on information received from the touchdown sensor 131.

In some embodiments, the touchdown sensor 131 may provide the tip-tilt information. That is, the touchdown sensor 131 may measure pressure on the pick-up head 133 at three contact points (e.g., angled 120° from each other) to help determine not just upward force received by the pick-up head 133, but angular force as well. (This force may be measured by measuring the movement of the pick-up head 133.) This angular force information can be used to calculate the parallelism of a light-emitting structure to the backplane. Here again, this information may be provided as feedback to create a "closed loop" that allows the fine positioning tool 105 to compensate for any tip-tilt misalignment. In some situations, the touchdown sensor 131 may first be used to compensate for tip-tilt misalignment prior to bonding, then further used in the manner previously described to create a constant hold pressure during bonding.

According to embodiments, these contact points may measure pressure by means of one or more pressure-sensing techniques, including piezoelectric sensing, laser interferometry, and the like. Depending on the technology used, the accuracy of the touchdown sensor 131 can be relatively high. For example, utilizing laser interferometry the touchdown sensor 131 may be able to detect movement within 10-12 nm. In other embodiments, the accuracy of the touchdown sensor 131 may be higher or lower.

In some embodiments, the fine positioning tool 105 may be able to manipulate the pick-up head 133 in with 6 degrees of freedom (6DOF). That is, the fine positioning tool 105 may be capable of manipulating the pick-up head 133 (and any light-emitting structures coupled therewith) forward/backward (surge), up/down (heave), left/right (sway) translation in three perpendicular axes, as well as rotation about the three perpendicular axes: yaw (normal axis), pitch (transverse axis), and roll (longitudinal axis). In some embodiments, the fine positioning tool 105 may be configured to manipulate the pick-up head 133 in a subset of the 6DOF.

The fine positioning tool 105 may be capable of manipulating the pick-up head 133 (and any light-emitting structures coupled therewith) with a degree of accuracy exceeding that of other tools. (Hence the "fine" positioning capabilities of the fine positioning tool 105.) In some embodiments, for example, the accuracy may be within 200 nm. Other embodiments may have a fine positioning tool 105 with the tolerance level greater or less than this.

According to embodiments herein, the fine positioning tool 105 may be capable of withstanding relatively high temperatures, to enable the fine positioning tool 105 to be used during a bonding process in which a light-emitting structure coupled to the pick-up head 133 is bonded to a backplane. In some embodiments, for example, the fine positioning tool 105, including the pick-up head 133, touchdown sensor 131, and any robotics configured to manipulate the pick-up head 133, are capable of withstanding heat up to 150° C. without losing positioning accuracy. In some embodiments, the fine positioning tool 105 may include one or more heat shields to help ensure that one or more subcomponents of the fine positioning tool 105 are thermally insulated during the bonding process. Once the life-emitting structure is bonded to the backplane, the fine positioning tool 105 can decouple the pick-up head 133 with the light-emitting structure.

The display assembly system 100 may further comprise a coarse positioning tool 110, which can include subcomponents such as an XY table 135, Z axes for the PUT (e.g. fine positioning tool 105), Z axes for LOT unit 139, and rotary tables 141. As with other components illustrated in FIG. 1, the coarse positioning tool 110 may comprise any number of the subcomponents illustrated in FIG. 1.

Here, the XY table 135 may comprise a substantially flat working surface 136 configured to move one or more components of the display assembly system 100 in an XY plane. The movement may be considered less accurate than the fine positioning tool 105 (hence the "course" designation of the coarse positioning tool 110). In some embodiments, for example, b the accuracy may be within 10 μm. In other embodiments, the tolerance of the movement of the XY table 135 may be greater or less than this.

Figure 2:
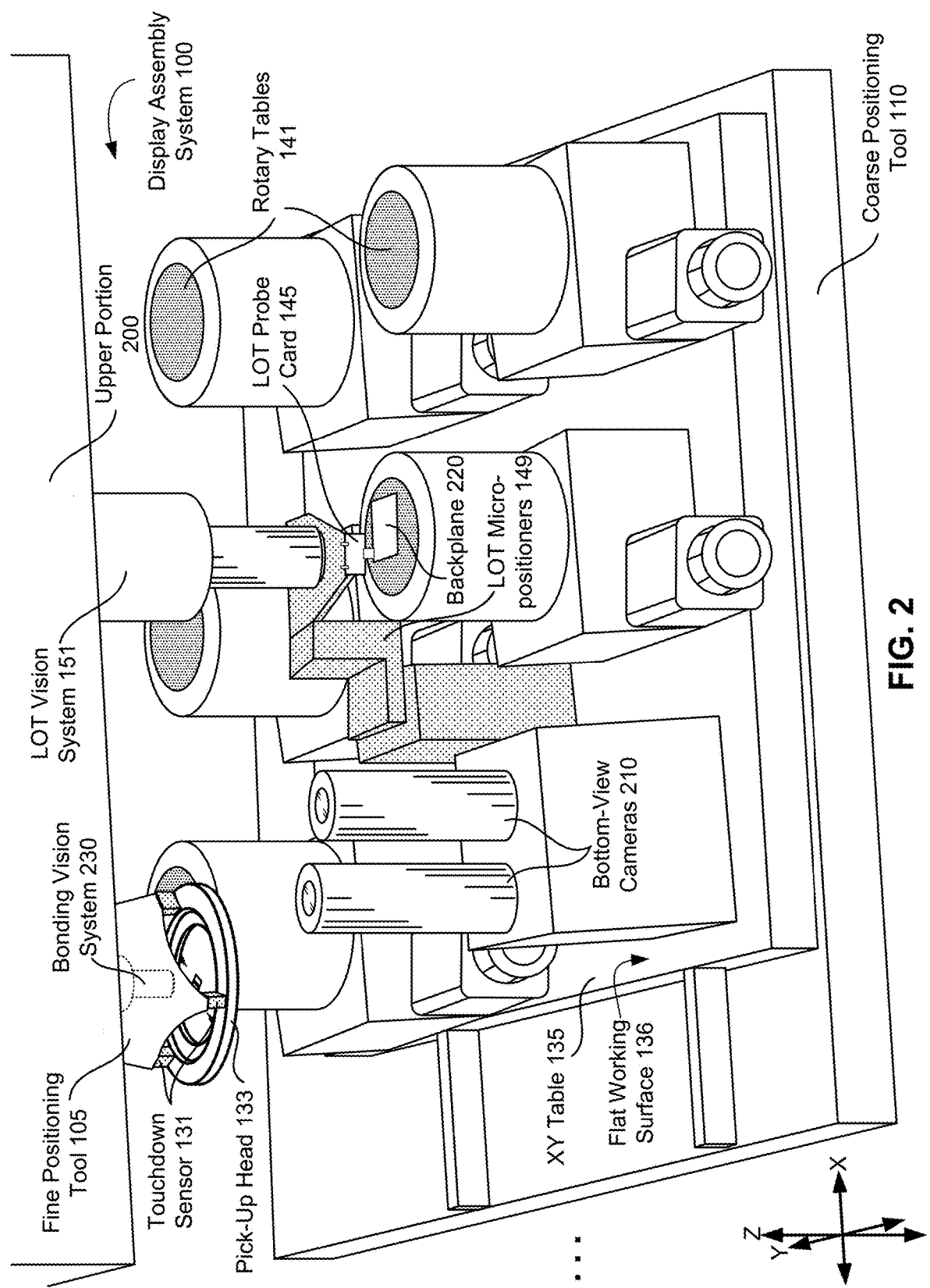
FIG. 2 is a perspective drawing of a display assembly system, according to an embodiment.

Various components may be capable of moving in the Z direction. This can include, for example, two Z axes for PUT 137, as illustrated in FIG. 1. These two Z axes include (1) a first axis capable of moving the PUT 137 jointly with a bonding vision system (e.g., a top-view camera of the PUT 137, as shown in FIG. 2 and described below) in the Z direction, and (2) a second axis capable of moving the bonding vision system separate from the PUT 137 itself, allowing the bonding vision system to change its focus point in the Z direction (e.g., from a pickup head of the PUT 137 to a working surface, such as a backplane on a rotary table). Additionally or alternatively, one or more servos may be used to move a LOT unit 115 (e.g., one z-axis for LOT unit 139).

As described in further detail below, the coarse positioning tool 110 may include a plurality of rotary tables 141. (That said, some embodiments may include only a single rotary table 141, or no rotary table 141, depending on desired functionality.) These rotary tables 141 may be capable of rotating items placed thereon (such as a carrier substrate and/or backplane on which one or more light-emitting structures may be disposed) in the XY plane of the XY table 135. One or more of these rotary tables 141 may be heated (as indicated by the heated tables 143). This heating may provide the heat necessary for bonding a light-emitting structure to a backplane. In some embodiments, for example, the heated tables 143 may be capable of heating components placed thereon to 250° C.–270° C. Additional details regarding the coarse positioning tool 110 are provided herein below.

The LOT unit 139 may be utilized to perform an LOT ("lights-on test"), in which one or more emitters of a light-emitting structure can be activated to determine whether a proper electrical connection has been made between the emitter and a corresponding backplane contact on the backplane and/or determine whether one or more emitters of the light-emitting structure are defective.

A probe card 145 can be used by the LOT unit 115 to provide electrical connection to a light-emitting structure located on a backplane. That is, the probe card 145 may include one or more probes that may come in contact with one or more respective electrical contact pads on the backplane. (In some embodiments, these respective electrical contact pads may be fabricated and utilized specifically for LOT testing.) The one or more respective electrical contact pads on the backplane may be, if the light-emitting structure is properly located on the backplane, electrically connected with a respective one or more emitters on the light-emitting structure. The microcontroller 147 may be utilized to provide electrical signals to one or more emitters of a light-emitting structure on the backplane during an LOT, and may be able to address each of the emitters of the light-emitting structure individually. Micropositioners 149 may be used to position the probe card 145 properly such that the probes of the probe card 145, are in proper electrical contact with the electrical contact pads on the backplane during the LOT.

The vision system 151 of the LOT unit 115 may be utilized to verify the functionality of emitters of the light-emitting structure subject to the LOT and/or help determine that probes of the probe card 145 are properly in electrical contact with respective electrical contact pads of the backplane. In some embodiments, the vision system 151 may comprise a closed loop camera, capable of providing real-time images of the light-emitting structure. These images may then be used to manipulate the micropositioners 149 to ensure the probes of the probe card 145 are properly aligned and in electrical contact with the electrical contact pads of the backplane. Additionally or alternatively, images may be taken of the light-emitting structure during the LOT to determine which emitters of the light-emitting structure are being activated. The various components of the LOT unit 115 (as well as the emitters of light-emitting structure during the LOT) may be powered by a power source 153.

The vision system 120 of the display assembly system 100 may comprise one or more cameras positioned in one or more locations of the display assembly system 100, according to desired functionality. The one or more cameras may be closed loop (e.g., capable of providing real-time and/or near-real-time images that can be used to position a tool (e.g., fine positioning tool 105, probe card 145, etc.) in an iterative fashion, based on information from the images) or "feed forward" (e.g., capable of providing images that can be used subsequent to image capture for tool placement). As discussed in further detail below, with regard to FIG. 2, these one or more cameras may comprise a one or more top-view cameras and/or bottom-view cameras, according to desired functionality. These one or more cameras may be utilized for visual servoing 155 (to help determine placement of various tools of the display assembly system 100 and/or items manipulated thereby) and/or LOT verification 157 (to help determine whether one or more emitters of a light-emitting structure subject to the LOT are properly activating).

Figure 9:
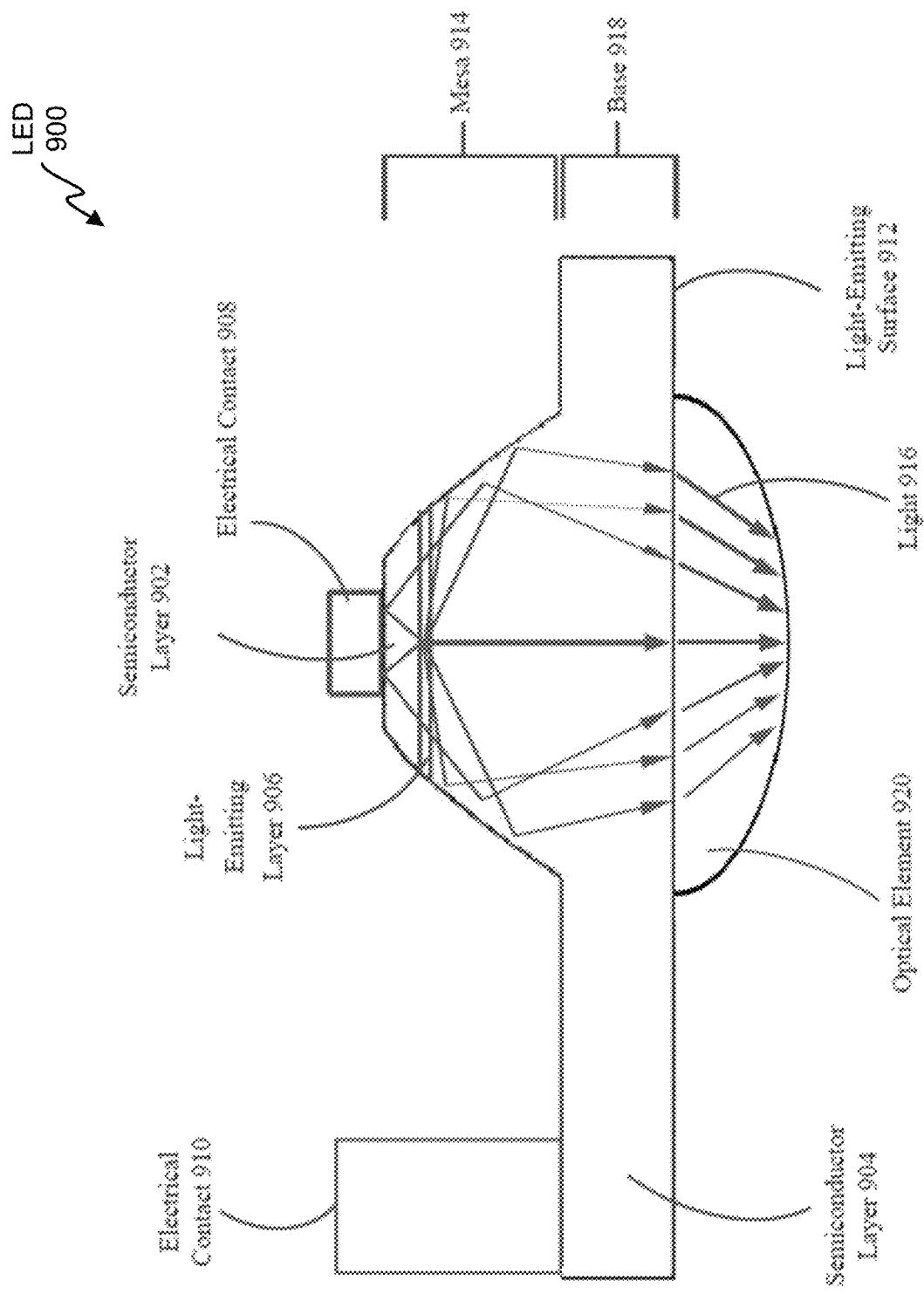
FIG. 9 is a cross-sectional view of an example of an LED, according to an embodiment.

The fine positioning tool 105, coarse positioning tool 110, LOT unit 115, and/or vision system 120 may be communicatively coupled with a computer system 125, which may be utilized to control the functionary under the control the function of each of these various components. In addition or alternatively, some of the control functions can be process by FPGA chips. It can be noted, however, that individual components may have varying degrees of functionality, and may include a computer system incorporated therewith. It should be noted that components illustrated in the computer system 125 are meant only to provide a generalized illustration of various components of a computer system 125, any or all of which may be utilized as appropriate. FIG. 9, therefore, broadly illustrates how individual system elements may be implemented in a relatively separated or relatively more integrated manner. In addition, it can be noted that components illustrated by FIG. 9 can be localized to a single device and/or distributed among various devices (such as the components illustrated), which may be disposed at different physical or geographical locations. The computer system 125 may comprise, for example, a server, desktop, laptop/notebook, tablet, smart phone, specialized hardware, and/or another such computing device.

The computer system 125 is shown comprising hardware elements that can be electrically coupled via a bus (not shown) or may otherwise be in communication, as appropriate. The hardware elements may include processor(s) 159, which can include without limitation one or more general-purpose processors, one or more special-purpose processors (such as digital signal processing chips, graphics acceleration processors, and/or the like), and/or other processing structure, which can be configured to perform (or cause the computer system 125 and/or display assembly system 100 to perform) one or more of the methods described herein. The computer system 125 also can include one or more input devices 161, which can include without limitation a mouse, a keyboard, a camera, a microphone, and/or the like; and one or more output devices 165, which can include without limitation a display device, a printer, and/or the like.

The computer system 125 may further include (and/or be in communication with) one or more non-transitory storage devices 163, which can comprise, without limitation, local and/or network accessible storage, and/or can include, without limitation, a disk drive, a drive array, an optical storage device, a solid-state storage device (e.g., a random access memory (RAM) and/or a read-only memory (ROM)), any of which can be programmable, flash-updateable, and/or the like. Such storage devices may be configured to implement any appropriate data stores, including without limitation, various file systems, database structures, and/or the like.

The computer system 125 may also include a communication interface 173, which can include support of wireline communication technologies and/or wireless communication technologies (in some embodiments) managed and controlled by a wireless communication interface. The communication interface 173 may include a modem, a network card (wireless or wired), an infrared communication device, a wireless and/or communication device and/or a communication chipset (e.g., Wi-Fi®, Bluetooth®, universal serial bus (USB), Ethernet, etc.), and/or the like. As illustrated, the communication interface 173 may permit the computer system 125 to communicate with (e.g., by exchanging signaling and data) various other components. In some embodiments, these additional components may include components not illustrated in FIG. 1.

In many embodiments, the computer system 125 will further comprise a memory 167, which can include a RAM and/or or ROM device. Software elements, shown as being located within the memory 167, can include an operating system 169, device drivers, executable libraries, and/or other code, such as application(s) 171, which may comprise computer programs provided by various embodiments, and/or may be designed to implement methods, and/or configure systems, provided by other embodiments, as described herein. One or more procedures described with respect to the method(s) discussed herein, may be implemented as code and/or instructions that are stored (e.g., temporarily) in memory 167 and are executable by the computer system 125 (and/or the processor(s) 159 within the computer system 125); in an aspect, then, such code and/or instructions can be used to configure and/or adapt a general purpose computer (or other device) to perform one or more operations in accordance with the described methods.

A set of these instructions and/or code might be stored on a non-transitory computer-readable storage medium, such as the storage device(s) 163 described above. In some cases, the storage medium might be incorporated within a computer system, such as computer system 125. In other embodiments, the storage medium might be separate from a computer system (e.g., a removable medium, such as an optical disc), and/or provided in an installation package, such that the storage medium can be used to program, configure, and/or adapt a general purpose computer with the instructions/code stored thereon. These instructions might take the form of executable code, which is executable by the computer system 125 (e.g., by processor(s) 159) and/or might take the form of source and/or installable code, which, upon compilation and/or installation on the computer system 125 (e.g., using any of a variety of generally available compilers, installation programs, compression/decompression utilities, and so forth), then takes the form of executable code.

FIG. 2 is a perspective drawing of a display assembly system 100, according to an embodiment. Here, various components of the display assembly system 100 of FIG. 1, are illustrated. Some components, such as the fine positioning tool 105 and LOT vision system 151, are suspended from an upper portion 200. Other components may be disposed on a lower portion comprising the coarse positioning tool 110.

As previously mentioned, the fine positioning tool 105 may be capable of operating with 6DOF. Additionally, XY table 135 can be used to move components thereon in the XY plane to position them underneath the fine positioning tool 105 as needed. For example, the XY table 135 may position any of the rotary tables 141 underneath the fine positioning tool 105. The fine positioning tool 105 can manipulate the pick-up head 133 and touchdown sensor 131 (here, illustrated with three sensing components (or "benders") attached to the pick-up head 133), and rotary tables 141

(and/or other components of the display assembly system 100) may be moved along the Z direction, to pick and/or place items on the rotary tables 141. When an item (e.g., a light-emitting structure) is coupled to the pick-up head 133, bottom-view cameras 210 (which may be part of the visual servoing subcomponent 155 of the vision system 120 of FIG. 1) can be used to image the item from a perspective below the pick-up head 133. Moreover, as noted above, a bonding vision system 230 may be positioned within the fine positioning tool 105, providing a top-view camera capable of viewing objects manipulated by the pick-up head 133 from above. As described in further detail below, because the pick-up head 133 may be at least partially transparent, this can enable the bonding vision system 230 to capture an image of the item from a perspective above the pick-up head 133, which can facilitate proper manipulation and alignment of the item. As noted in FIG. 1, one or more rotary tables 141 may be heated to enable bonding of components (e.g., one or more light-emitting structure and a backplane) disposed thereon.

FIG. 2 additionally illustrates components that may be used during LOT. Here, a backplane 220 is disposed on a rotary table 141 (not labeled). A LOT probe card 145, is electrically coupled to the backplane 220 and held into place by components that comprise LOT micropositioners 149 that may be separate from the rotary table on which the backplane 220 is disposed and may be used to help position the LOT probe card 145 during LOT. LOT vision system 151 may comprise a camera with closed loop functionality, providing images of the LOT probe card 145 and a backplane 220 to help enable the LOT micropositioners 149 to position the LOT probe card 145 correctly. During LOT, the LOT probe card 145 may cause certain emitters of a light-emitting structure to become activated, and the LOT vision system 151 can be used to capture images of the emitters, to verify functionality. Additionally or alternatively, as discussed in more detail below, the fine positioning tool 105 may be used during LOT for active optical alignment in which the top-view camera of the fine positioning tool 105 can be used to capture images of activated emitters and manipulate the corresponding light-emitting structure to ensure optimal brightness of the emitters prior to bonding.

FIG. 3A is a cross-sectional view of a light-emitting structure 310, which may comprise a micro-LED die, in accordance with one embodiment. The light-emitting structure 310 may include, among other things, a semiconductor element 312, bonding pads 314, and electrical interconnects 316. The semiconductor element 312 may, in some embodiments, comprise semiconducting material such as gallium nitride (GaN), gallium arsenide (GaAs), or the like, made by epitaxial growth (epitaxy) or other fabrication methods. The electrical interconnects 316 serve to electrically connect the bonding pads 314 (which serve as electrical contacts of the light-emitting structure 310) to respective backplane contacts when the light-emitting structure 310 is mounted to the backplane during LOT and bonding. Dimensions of the light-emitting structure 310 may vary depending on desired functionality, manufacturing processes, and/or other factors.

The electrical interconnects 316 may be provided in the form of bumps or microbumps, for interconnection of the light-emitting structure 310 to an electrical conductor. The electrical contacts may be arranged on a surface of the light-emitting structure 310 and may be formed on top of the p- and n-contacts of a micro-LED in the semiconductor element 312, which may be arranged on a contact surface 318 of the semiconductor element 312 opposite to the light-emitting surface 320. The electrical interconnects 316 and bonding pads 314 may be made of a metal (e.g., copper (Cu), tin (Sn), and/or other metals). In some embodiments, a single electrical interconnect 316 for an emitter (e.g., an anode of a micro-LED) may be located near the emitter (e.g., on a surface opposite the light-emitting surface of the emitter), and the other electrical interconnect 316 (e.g., the cathode of the micro-LED) may be electrically connected with other emitters in the light-emitting structure, forming common electrical interconnects 316, which may be located elsewhere (e.g., at an end of the light-emitting structure 310).

FIG. 3B is a perspective view of a light-emitting structure 310, according to an embodiment. Here, the light-emitting structure 310 comprises a die having two rows of offset emitters 323 (which may effectively comprise a single output row in the resulting display, depending on desired functionality). That is, rows may be offset to provide a more compact horizontal (or vertical) output pitch in the resulting display. Additionally, as illustrated in FIG. 3B, electrical interconnects 316 may be slightly offset from corresponding emitters 323. Additional details regarding this potential spatial offset are described below.

It can be noted that, alternative embodiments may vary from the embodiment illustrated in FIG. 3B. For example, emitters 323 may be arranged differently on the light-emitting structure 310, the light-emitting structure 310 may have a different shape, there may be more or fewer rows (including only a single row) of emitters 323, emitters 323 may have two contacts each (e.g., rather than sharing a common electrical contact among multiple emitters 323) and/or there may be more or fewer emitters 323 (including only a single emitter 323), etc. A person of ordinary skill in the art will appreciate other such variations.

It can be noted that FIGS. 3A and 3B are simplified drawings provided for illustrative purposes. Embodiments of a light-emitting structure 310 may comprise additional features not explicitly shown in FIGS. 3A and 3B, or other figures herein. For example, embodiments may include one or more obtrusions, or mesas, which may help direct light generated by the light-emitting structure 310. Some embodiments may include one or more mesas located on the contact surface 318. In such embodiments, an electrical interconnect 316 may be located on or near a mesa. Other embodiments may include one or more mesas located on the light-emitting surface 320.

Figure 4A:
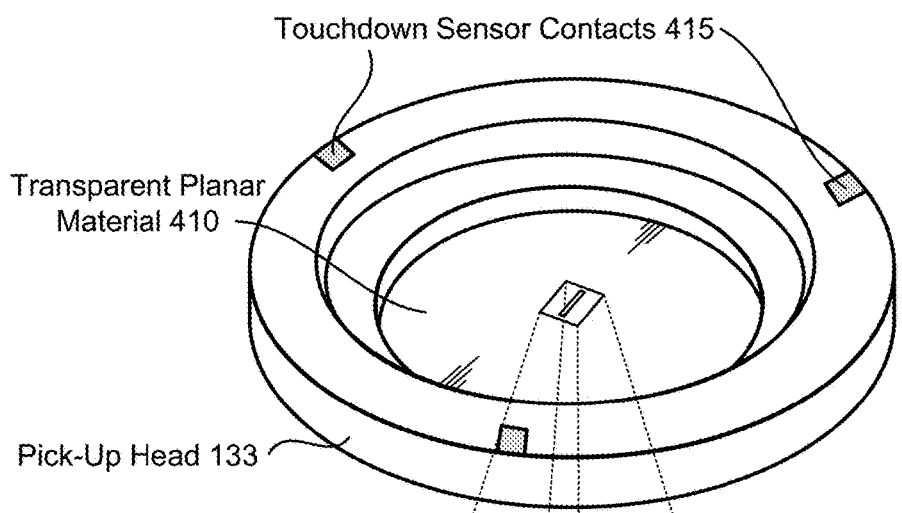
FIGS. 4A-4C are perspective and cross-sectional views of a pick-up head 133 and portions thereof, according to an embodiment.
Figure 4B:
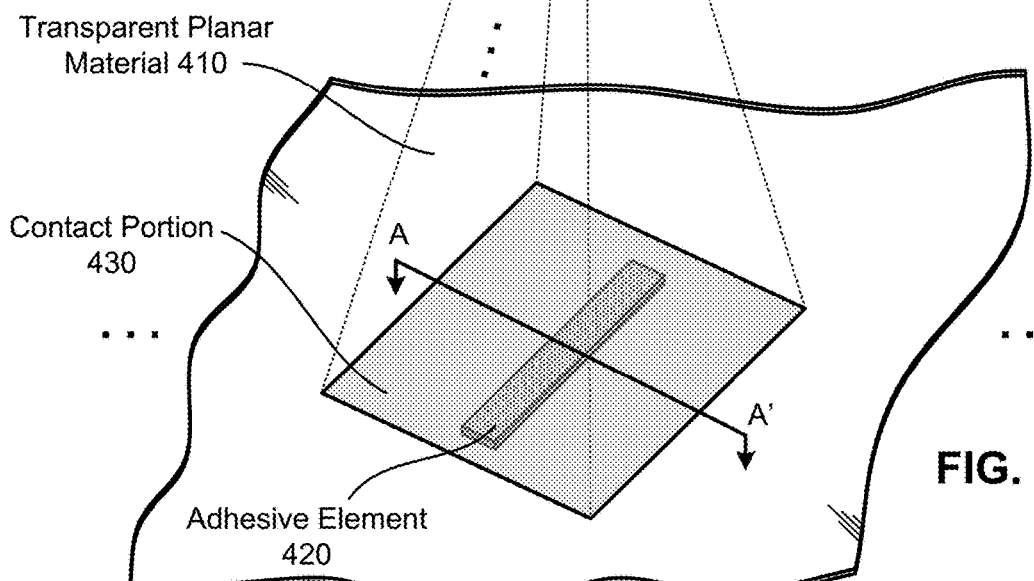
Figure 4C:
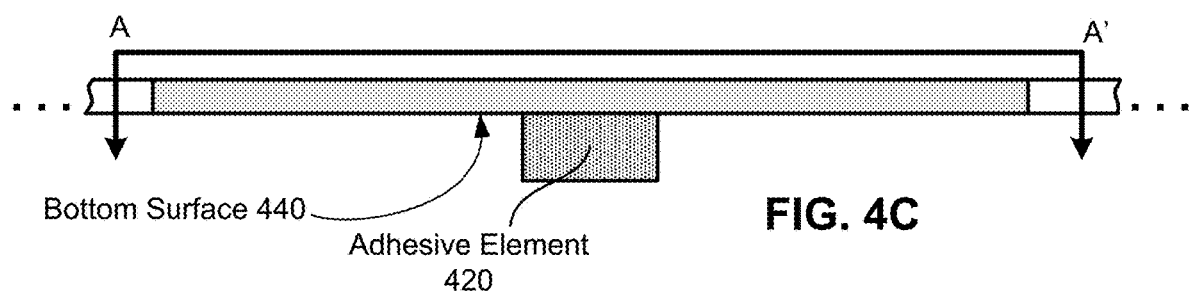

FIGS. 4A-4C are perspective and cross-sectional views of a pick-up head 133 and portions thereof, according to an embodiment. In this embodiment, the pick-up head 133 comprises a transparent planar material 410 and touchdown sensor contacts 415. The transparent planar material 410 may comprise a material (e.g., glass) that is substantially transparent (enabling a top-view camera (not shown) to capture images (including live-feed video, for example) through the transparent planar surface 410) and the substantially flat (enabling the pick-up head 133 to more easily pick and place items having substantially flat surfaces).

As illustrated in FIG. 4B, an adhesive element 420 may be coupled with a contact portion 430 of the transparent planar material 410. The contact portion 430 and adhesive element 420 may be disposed within a field of view of the top-view camera to enable the top-view camera to capture images of at least a portion of the contact portion 430 and adhesive element 420.

As illustrated in the cross-sectional view of FIG. 4C, the adhesive element 420 may be coupled to a bottom surface 440 of the contact portion 430 of the transparent planar material 410. The adhesive element 420 itself may comprise a polymer capable of adhering to items, such as a light-emitting structure 310, to pick them from a carrier substrate and place them on a backplane and/or other substrate. The adhesive element 420 may also be at least partially transparent, enabling the top-view camera to capture images of the top of a light-emitting structure 310 (not shown) coupled thereto. Bottom-view cameras (such as bottom-view cameras 210 of FIG. 2) facing the opposite direction in (i.e., toward the bottom surface 440) may additionally or alternatively capture images of the bottom of items coupled thereto. Adhesion of the adhesive element 420 may be due to the physical texture and/or chemical makeup of the adhesive element 420.

Figure 5A:
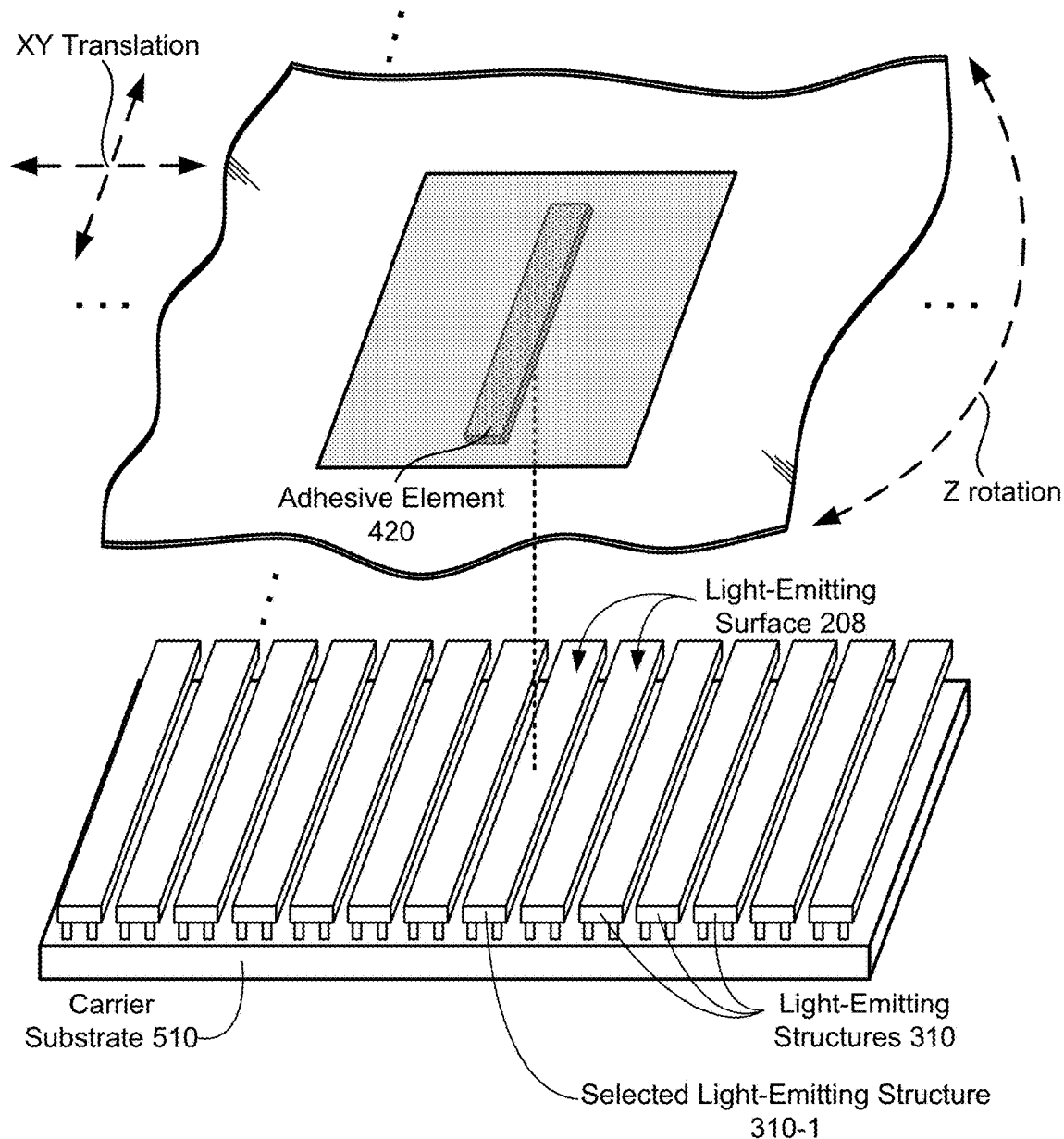
FIGS. 5A-5C are perspective views of portions of a pick-up head, light-emitting structures, and carrier substrate; illustrating a process of picking up and light-emitting structure according to an embodiment.
Figure 5A:
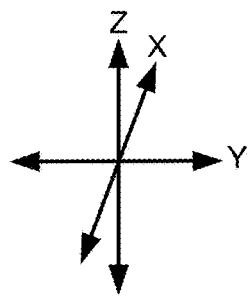
Figure 5B:
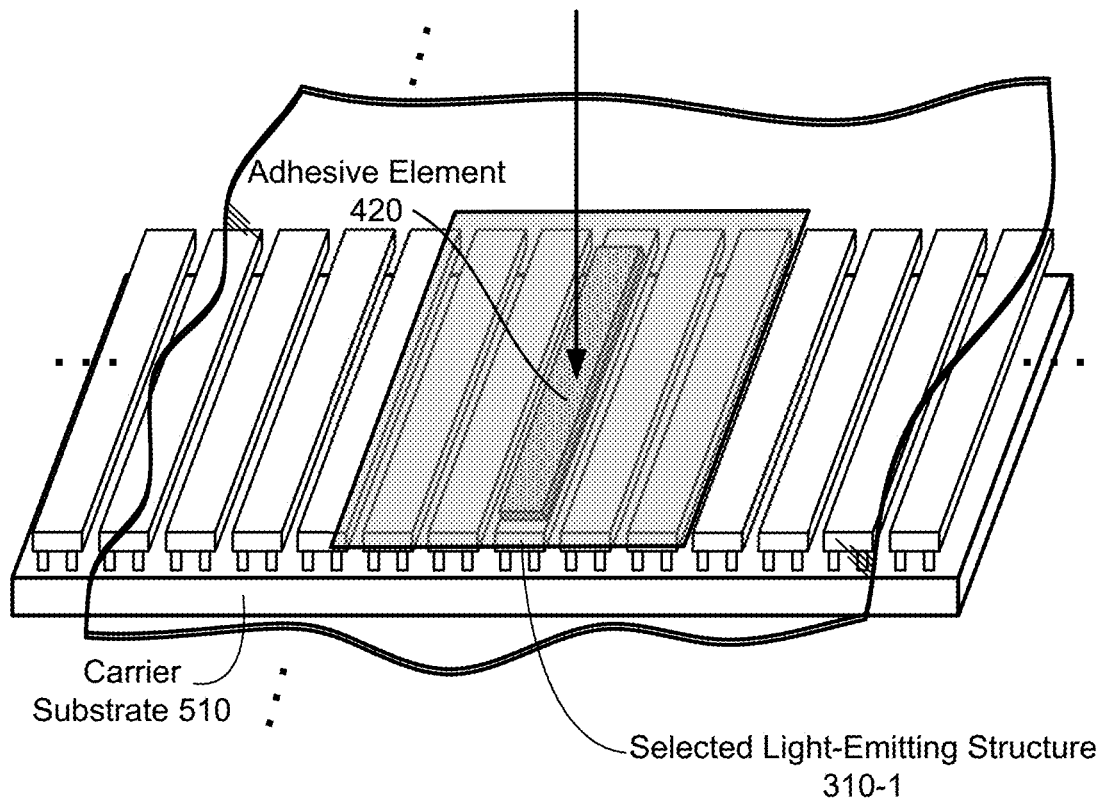
Figure 5B:
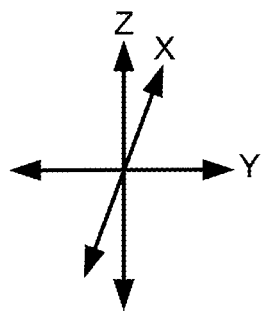
Figure 5C:
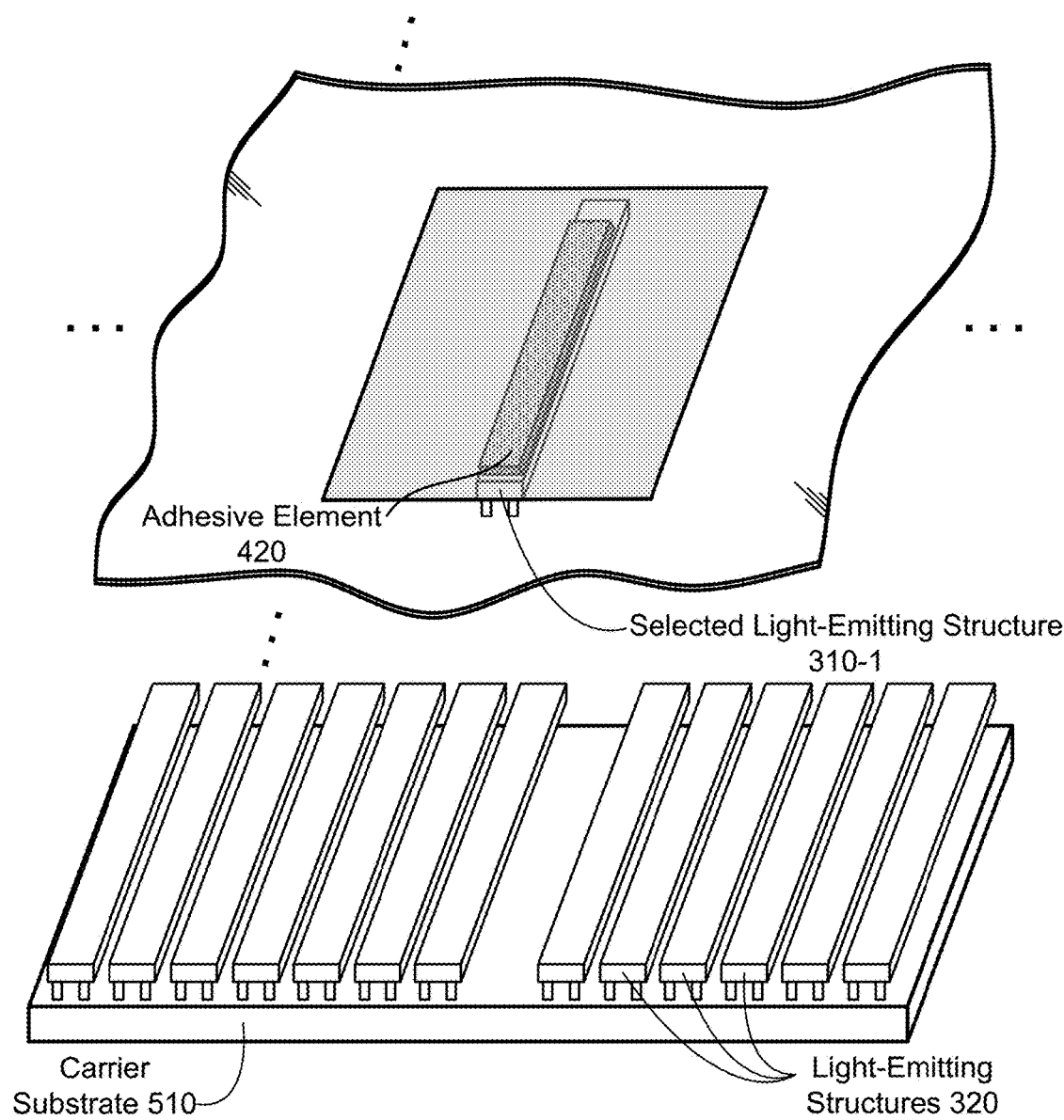
Figure 5C:
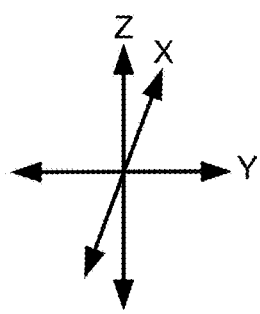

FIGS. 5A-5C illustrate the pick-up functionality of the pick-up head 133, according to an embodiment. As part of the fabrication process, multiple light-emitting structures 310 may be located on a carrier substrate 510 after singulation, as illustrated in FIG. 5A. Using the top-view camera of the fine positioning tool 105, a light-emitting structure 310-1 be selected from the multiple light-emitting structures 310. Using the 6DOF maneuverability of the fine positioning tool 105 (and using a top-down camera to provide visual feedback) the fine positioning tool 105 may maneuver the pick-up head 133 to align the adhesive element 420 with the selected light-emitting structure 310-1. (Although only XY translation and Z rotation are illustrated, alignment may also involve X and Y rotation to ensure the adhesive element is aligned with the XY plane.) The pick-up head 133 may further be configured to illuminate the adhesive element 420 and/or selected light-emitting structure 310-1.

Once aligned, the pick-up head 133 can be lowered (e.g., in the −Z direction) to cause the adhesive element 420 to come in physical contact with the selected light-emitting structure 310-1, as illustrated in FIG. 5B. More specifically, a lower surface of the adhesive element 420 can be lowered to adhere to an upper surface (e.g., the light-emitting surface 320) of the selected light-emitting structure 310-1. The touchdown sensor 131 of the fine positioning tool 105 may be utilized to help ensure a sufficient amount of pressure is applied to the selected light-emitting structure 310-1 to ensure a proper adhesive coupling with the adhesive element 420 without damaging the selected light-emitting structure 310-1.

The pick-up head 133 can then be raised (e.g. in the Z direction) to lift the adhesive element 420 and selected light-emitting structure 310-1 from the carrier substrate 510, as shown in FIG. 5C. In some embodiments, there may be at least portions of an adhesive layer (not shown) on the carrier substrate 510 adhering the light-emitting structures 310 to the carrier substrate 510. These portions of the adhesive layer may be deliberately left (e.g. after an etching process removing other portions of the adhesive layer) to help ensure light-emitting structures 320 remain in place on the carrier substrate 510. As such, the adhesive force of the adhesive element 420 may overcome any adhesive force of the remaining portions of the adhesive layer on the carrier substrate 510 to allow for the decoupling of the selected light-emitting structure 310-1 from the carrier substrate 510 as shown in FIG. 5C.

Figure 6A:
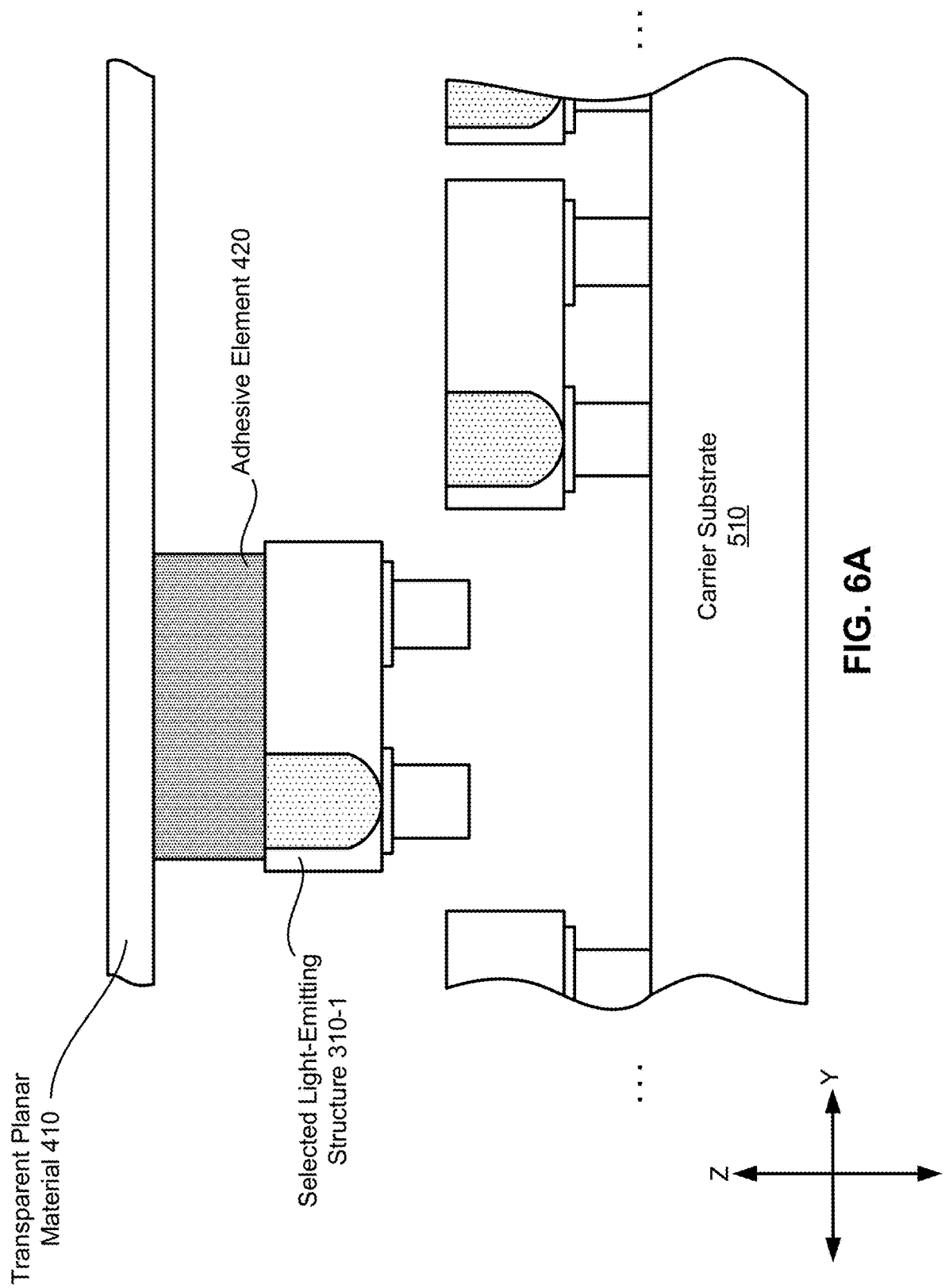
FIGS. 6A-6C are cross-sectional views of portions of a pick-up head, a selected light-emitting structure, and other components, illustrating active optical alignment during a "lights-on" test (LOT), according to an embodiment.
Figure 6B:
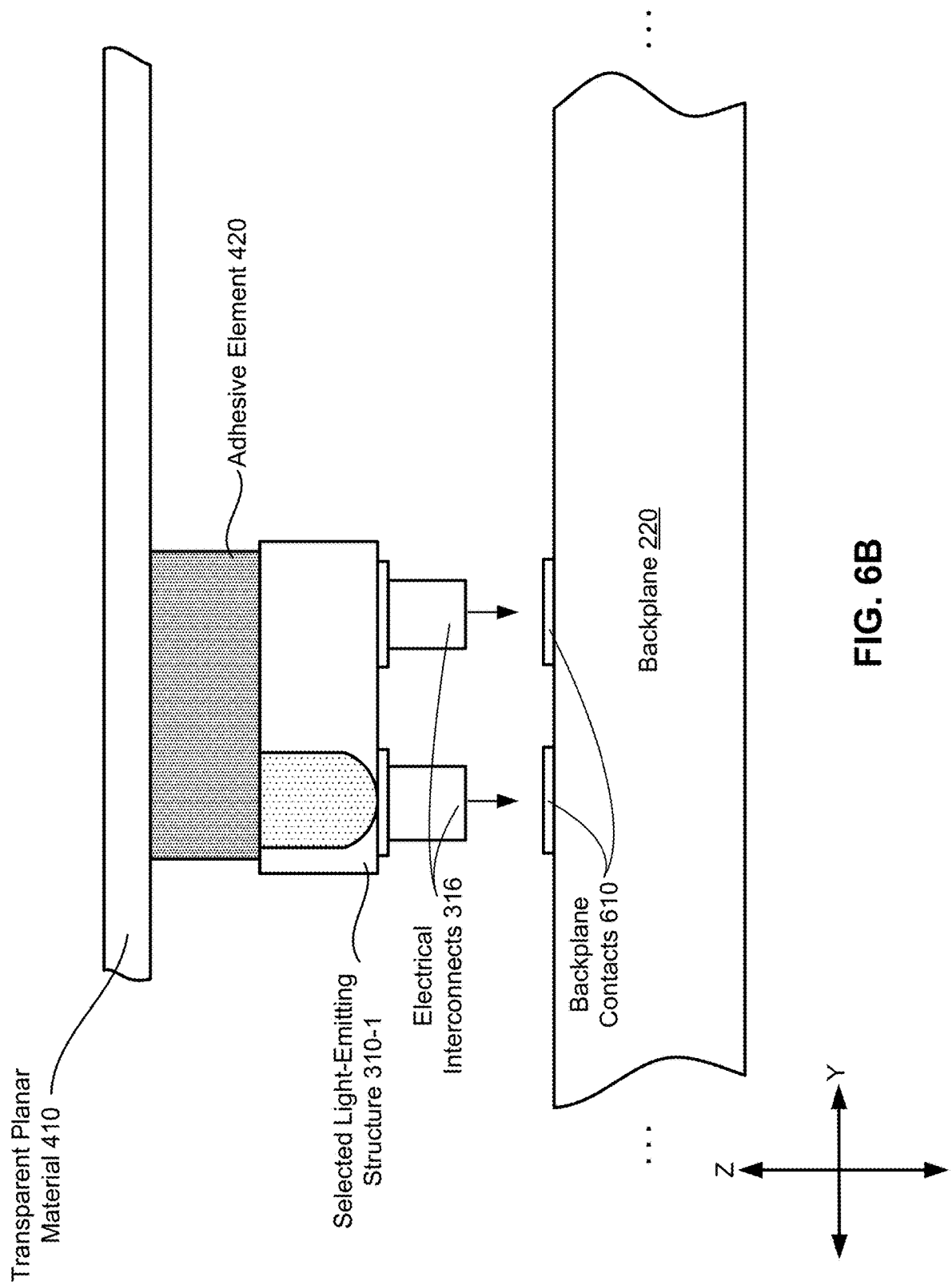
Figure 6C:
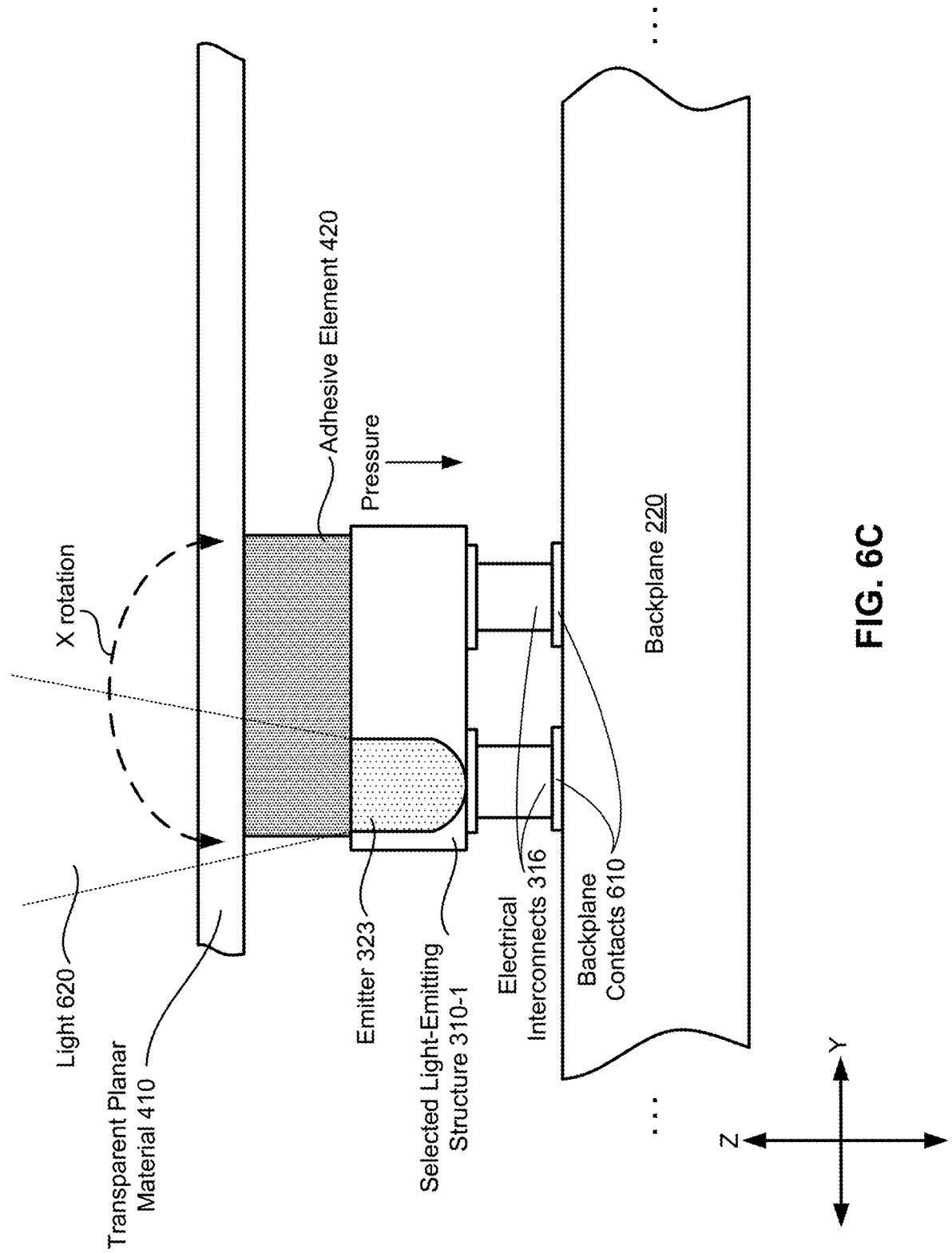

FIGS. 6A-6C are cross-sectional views of the transparent planar material 410, adhesive element 420, selected light-emitting structure 310-1, and other components, illustrating active optical alignment during a LOT, according to an embodiment. FIG. 6A illustrates the decoupling of the selected light-emitting structure 310-1 from the carrier substrate 510, similar to FIG. 5C.

FIG. 6B illustrates how the selected light-emitting structure 310-1 may then be aligned with features on a backplane 220. More specifically, pick-up head 133 is manipulated such that the electrical interconnects 316 of the selected light-emitting structure 310-1 align with respective backplane contacts 610 of the backplane 220.

As illustrated in FIG. 6C, the pick-up head 133 is then lowered (in the −Z direction) such that the electrical interconnects 316 of the selected light-emitting structure 310-1 come in physical contact with the backplane contacts 610. In some embodiments, bonding may be performed prior to a LOT. However, in other embodiments, the pick-up head 133 may be utilized to conduct a LOT prior to the bonding. Moreover, the pick-up head 133 may be used to perform active optical alignment during LOT, prior to the bonding of the selected light-emitting structure 310-1 to the backplane 220. The pick-up head 133 may be used to apply pressure to the selected light-emitting structure 310-1 (in the −Z direction, as illustrated) during the LOT and/or bonding process.

For active optical alignment, not only can the LOT be used to test electrical conductivity between one or more emitters 323 of the selected light-emitting structure 310-1, but the pick-up head 133 can rotate the selected light-emitting structure 310-1 to help ensure optimal directionality of the light 620 in it by the emitters 323. For example, during active optical alignment, a top-view camera may be configured to capture one or more images of one or more activated light emitters 323. Using these images as input, the pick-up head 133 can rotate the selected light-emitting structure 310-1 (e.g., about the X axis as illustrated in FIG. 6C, and/or about the Y axis) to optimize the brightness of the light 620 from the perspective of the top-view camera. Optimization of brightness may comprise, for example, maximizing the brightness, ensuring brightness is within a predetermined range or above a brightness threshold, and/or achieving a threshold amount of uniformity of brightness between multiple emitters 323 of the selected light-emitting structure 310-1 and/or emitters 323 across multiple light-emitting structures 310. Different thresholds and/or tolerances may be applied to different emitters, which may be based on the color emitted by the emitters. Determining the optimal angle at which the selected light-emitting structure 310-1 is to be bonded to the backplane 220 may further be based on input data from the touchdown sensor, which may provide angular information regarding the pick-up head 133. Once the fine positioning tool 105 manipulates the selected light-emitting structure 310-1 to the optimal angle (or within a threshold of that angle), the fine positioning tool 105 may be further used to hold the selected light-emitting structure 310-1 in place during the bonding process. As indicated elsewhere herein, the fine positioning tool 105 may be capable of withstanding high heat temperatures during the bonding process to help ensure no damage is made to servos and/or other components of the fine positioning tool 105 during the bonding process.

FIGS. 7A-7D are simplified cross-sectional illustrations of a process in which various spatial offsets of features of a selected light-emitting structure 310-1 and backplane 220 may be determined.

Figure 7A:
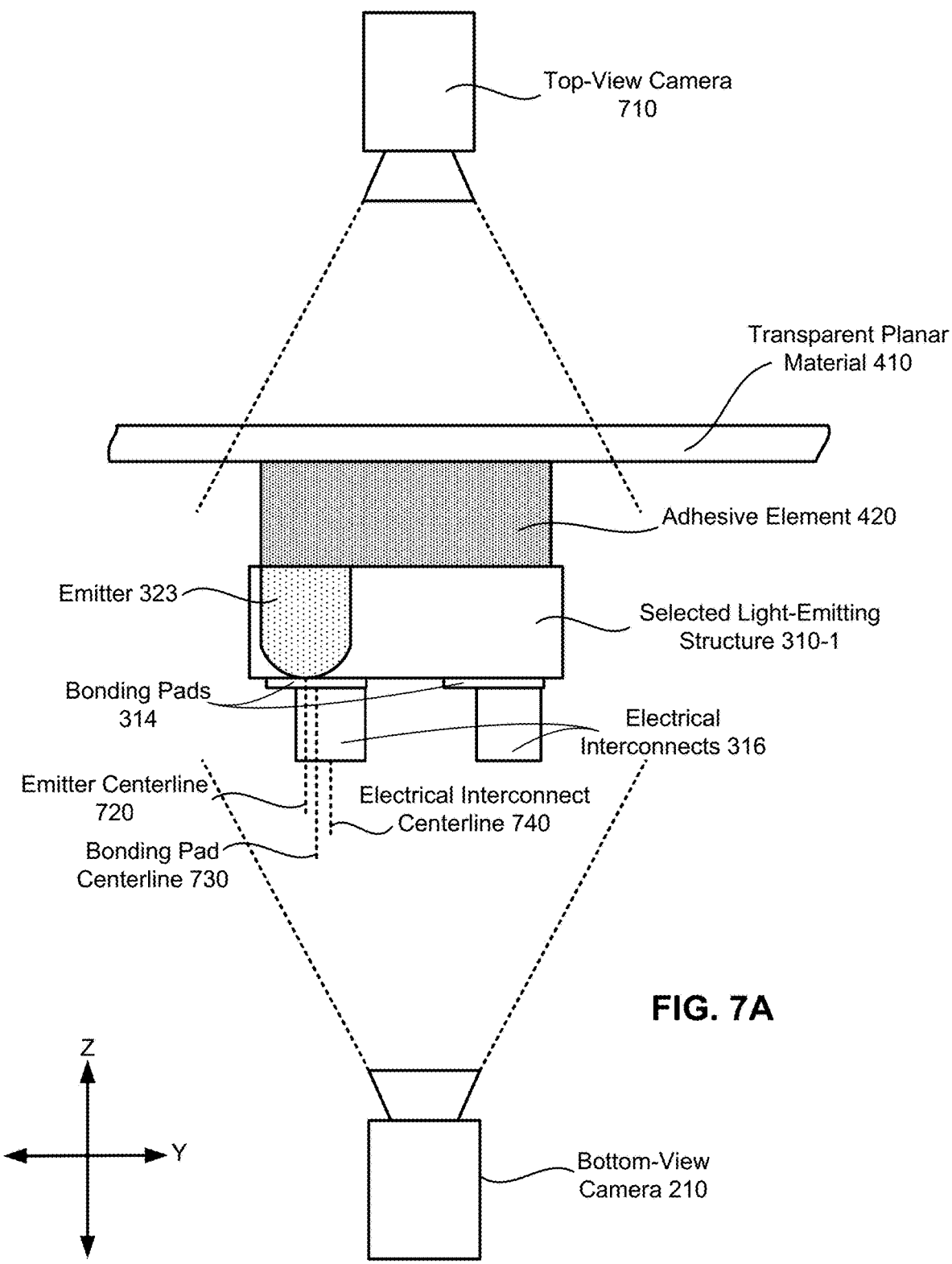
FIGS. 7A-7D are simplified cross-sectional illustrations of a process in which various spatial offsets of features of a light-emitting structure and backplane may be determined.

As illustrated in FIG. 7A, and as indicated previously, a top view camera 710 (e.g., bonding vision system 230) may be configured to capture images of a selected light-emitting structure 310-1 before, after, or while the selected light-emitting structure 310-1 is coupled to the adhesive element 420. In some embodiments, the ability to do so is enabled due to the fact that the transparent planar material 410 and adhesive element 420 are both at least partially transparent.

As such, with regard to emitter 323, images captured by the top-view camera 710 may indicate where the emitter 323 is, relative to the selected light-emitting structure 310-1. (In some embodiments, a location of the emitter 323 comprising a micro-LED may be determined by a location of the p-contact of the micro-LED.) Moreover, because the selected light-emitting structure 310 itself may be at least partially transparent, the bonding pads 314 may also be visible in images captured by the top-view camera 710. As such, a spatial offset between the emitter centerline 720 and bonding pad centerline 730 may be determined. However, the bonding pads 314 may not be transparent. And thus, a determination of where electrical interconnects 316 are disposed, relative to the bonding pads 314, may not be determinable from images captured by the top-view camera 710.

On the other hand, the bottom-view camera 210 may be configured to capture images of the selected light-emitting structure 310-1 from a view substantially opposite the view of the top-view camera 710. As such, the bottom-view camera 210 may be able to capture images of the electrical interconnects 316 and bonding pads 314 to allow the determination of a spatial offset between an electrical interconnects centerline 740 and the bonding pad centerline 730.

With the spatial offset between the emitter centerline 720 and the bonding pad centerline 730 determined, and the offset between the electrical interconnects centerline 740 and the bonding pad centerline 730 determined, the spatial offset between the emitter centerline 720 and the electrical interconnects centerline 740 may then be determined. This can, for example, be determined automatically by the computer system 125, or with some level of user input, depending on desired functionality.

Figure 7B:
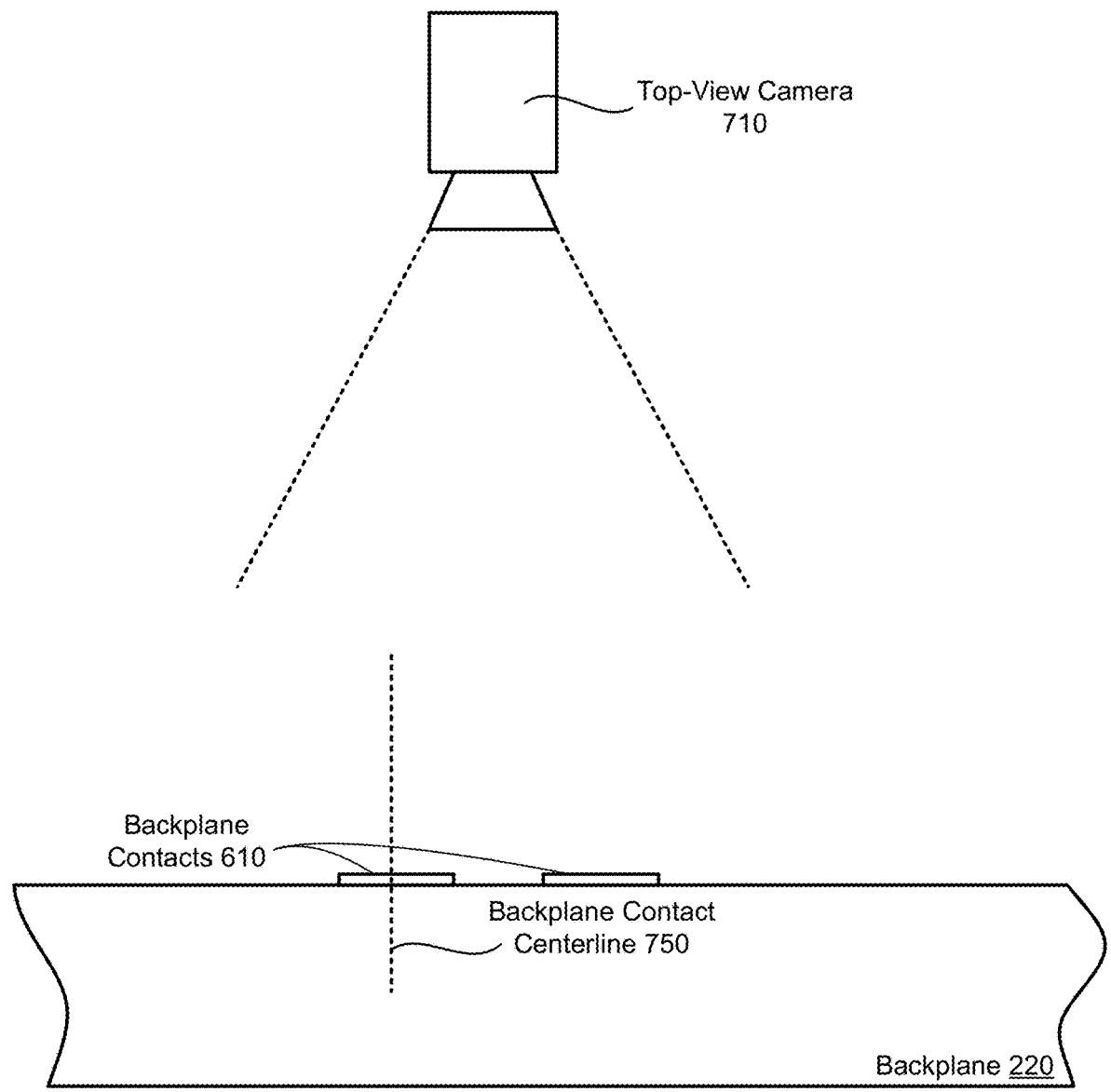
Figure 7B:
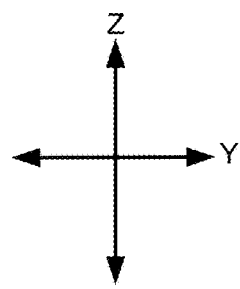

FIG. 7B illustrates how the top-view camera 710 may separately capture an image of backplane contacts 610 of the backplane 220. With this information, a location of the backplane contacts centerline 750 (e.g., relative to the backplane 220 and/or other features—e.g., corners, edges, other contacts, etc.—thereof) may be determined.

Figure 7C:
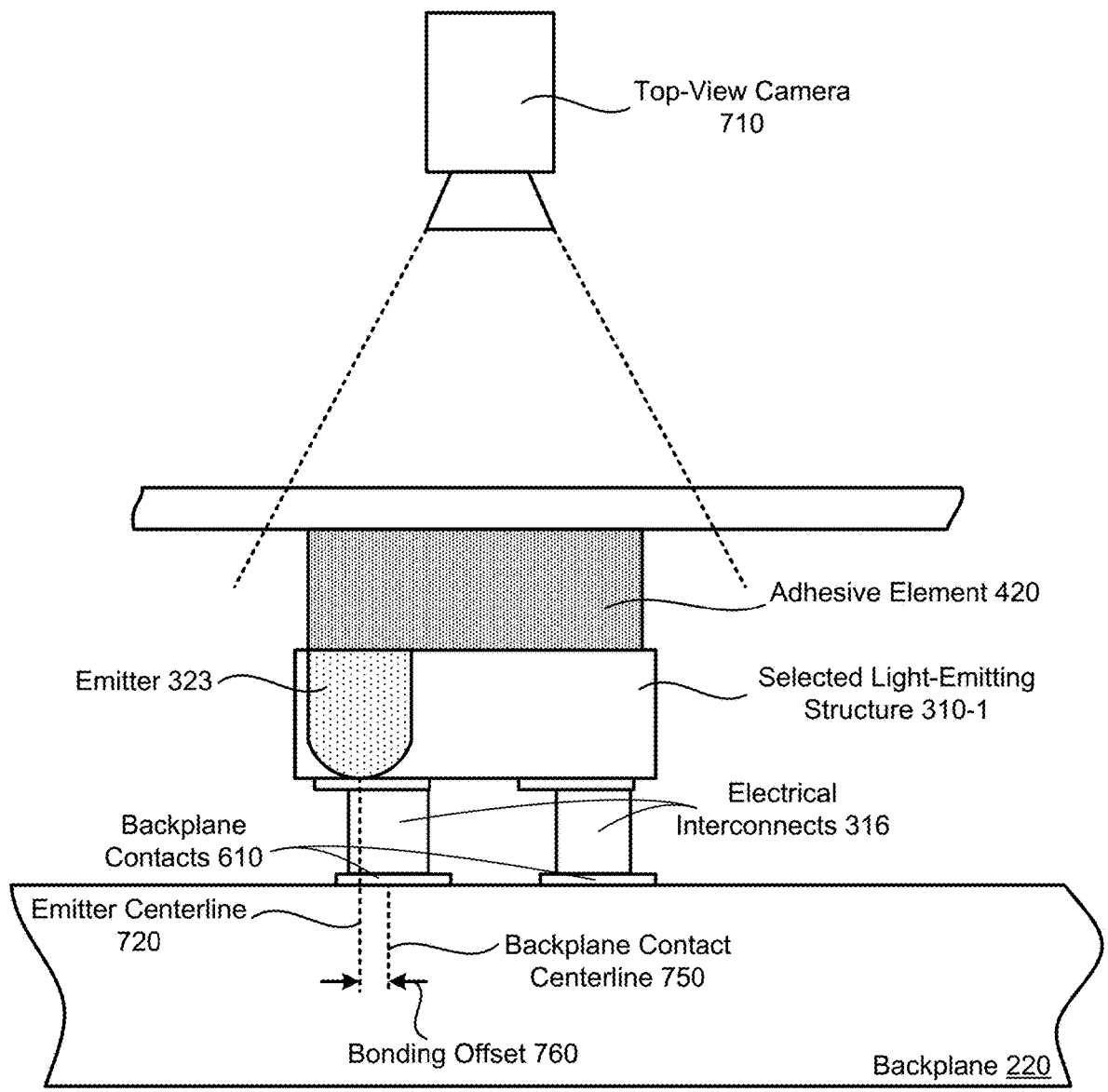

FIG. 7C is an illustration of how the selected light-emitting structure 310-1 can then be aligned with the backplane contacts 610 during a LOT and/or a bonding process. Because the offset between the emitter centerline 720 and electrical interconnects centerline 740 is known, and the backplane contact centerline 750 is known, the top-view camera 710 can then be used to determine and/or adjust a bonding offset 760 to help ensure various conditions and/or tolerances are met. Such conditions may include, for example, ensuring at least a minimum amount of contact between the electrical interconnects 316 and backplane contacts 610. Other conditions may be related to the emitters 323.

Figure 7D:
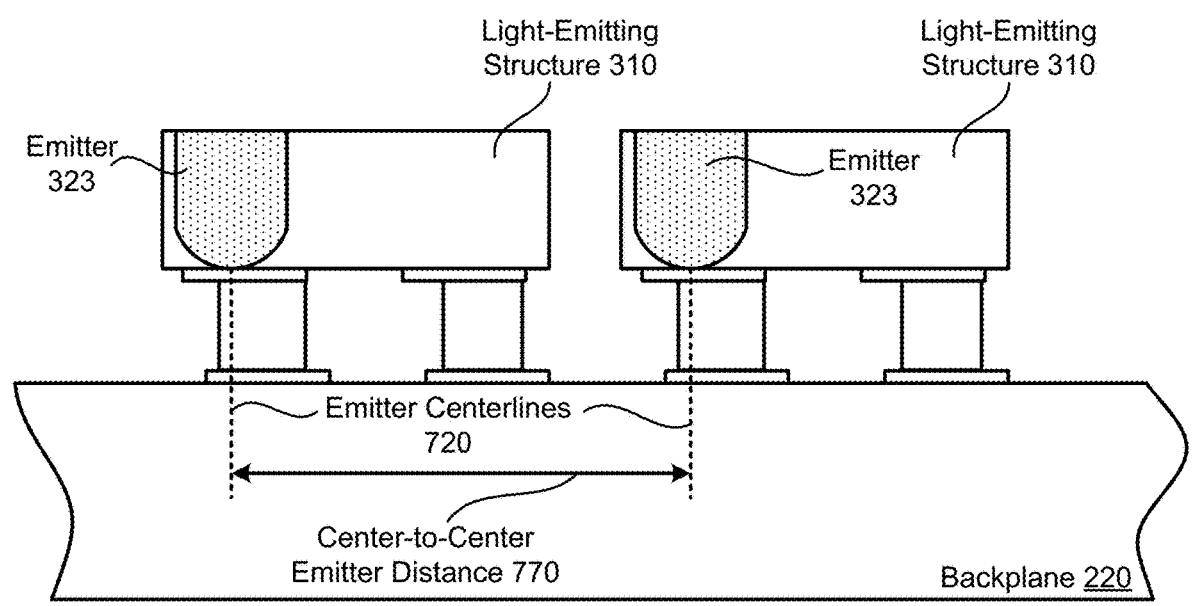
Figure 7D:
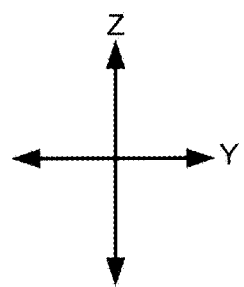

FIG. 7D is a cross-sectional diagram illustrating a center-to-center emitter distance 770, according to an embodiment. According to some embodiments of a light assembly of a display composed of the backplane 220 and a plurality of light-emitting structures 310, it may be desirable to have a center-to-center emitter distance 770 between emitters 323 of adjacent light-emitting structures 310 to be relatively uniform, within certain tolerances. According to some embodiments, for example, where emitter widths are approximately 3-5 μm, it may be desirable to ensure uniformity of this measurement equal to or less than 1 μm to avoid undesirable visual effects in the display (blurring, visual artifacts, etc.). (Alternative embodiments may have higher or lower tolerances.)

As noted, the top-view camera 710 can help ensure proper XY alignment (displacement and rotation), and the pick-up head 133 can be used to ensure this alignment is maintained during the LOT and/or bonding process. Additionally, the touchdown sensor 131 of the fine positioning tool 105 can be used to help ensure proper Z displacement and rotation. In some embodiments, it may be desirable to offset different colors with different Z-displacement offsets. For example, in some embodiments, it may be desirable to locate emitters 323 of light-emitting structures that emit blue and green light at substantially the same distance in the Z direction from the backplane 220. For red emitters, however, it may be desirable to locate them at a distance 500 nm shorter than the distance of the blue and green emitters. The touchdown sensor 131 can be utilized to help determine the proper distance of the various light-emitting structures 310 (e.g., of different colors) from the backplane 220 in the Z direction during bonding and/or LOT.

Figure 8:
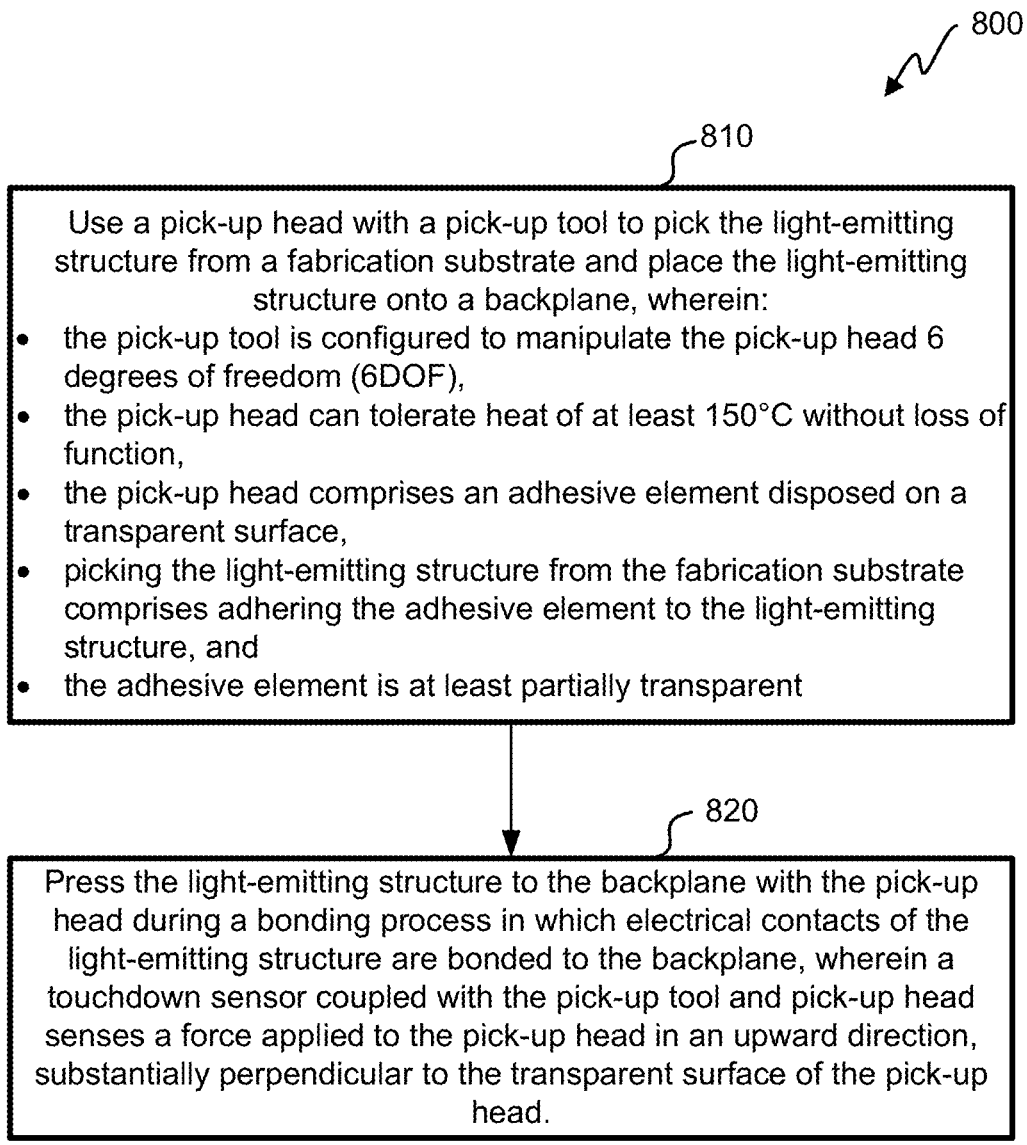
FIG. 8 is a flow diagram of a method of assembling a display, according to an embodiment.

FIG. 8 is a flow diagram of a method 800 of assembly a display, according to an embodiment. Alternative embodiments may add, separate, rearrange, and/or otherwise alter the functionality of the blocks illustrated in FIG. 8. A person of ordinary skill in the art will recognize such alterations. Means for performing the method may include hardware and/or software components of a computer system, including the computer system 125 of FIG. 1.

At block 810, the functionality comprises using a pick-up head with a pick-up tool to pick the light-emitting structure from a fabrication substrate and place the light-emitting structure onto a backplane. Here, the pick-up tool is configured to manipulate the pick-up head 6 degrees of freedom (6DOF), the pick-up head can tolerate heat of at least 150° C. without loss of function, the pick-up head comprises an adhesive element disposed on a transparent surface, picking the light-emitting structure from the fabrication substrate comprises adhering the adhesive element to the light-emitting structure, and the adhesive element is at least partially transparent. As previously indicated, these various features can enable desirable functionality, such as active optical alignment, spatial offset determination, and the like.

At block 820, the method 800 further comprises pressing the light-emitting structure to the backplane with the pick-up head during a bonding process in which electrical contacts of the light-emitting structure are bonded to the backplane, wherein a touchdown sensor coupled with the pick-up tool and pick-up head senses a force applied to the pick-up head in an upward direction, substantially perpendicular to the transparent surface of the pick-up head (e.g., in the Z direction of FIGS. 5A-7A). In some embodiments, the method 800 may further comprise heating the light-emitting structure and the backplane during the bonding process with a heated rotary table.

According to embodiments, the method 800 may include one or more additional functions, depending on desired functionality. For example, the method 800 may further comprise, after placing the light-emitting structure onto the backplane and prior to the bonding process, testing electrical connectivity between the light-emitting structure and the backplane by activating light emitters of the light-emitting structure via electrical contacts on the backplane. As indicated in the embodiments herein, this testing may comprise a LOT, which may involve one or more components of a LOT unit 115 (as illustrated in FIG. 1, for example). As indicated in embodiments herein, an ability to adjust and alignment of the light-emitting structure with respect to the backplane can allow for active optical alignment. As such, the method 800 may further comprise causing a camera (e.g.

a top-view camera, a LOT vision system, etc.) to capture one or more images of the activated light emitters, determine an angle at which the pick-up head is to press the light-emitting structure to the backplane during the bonding process, based at least in part on the one or more images, and cause the pick-up tool to press the light-emitting structure to the backplane at the determined angle during the bonding process. As previously indicated, the angle to which the pick-up head is to press the light-emitting structure may be determined by determining an optimal angle at which the light-emitting structure is to be bonded to the backplane. This may be dependent on a direction at which light from one or more emitters of the light-emitting structure is emitted. Moreover, as previously indicated, such optimization may depend on desired functionality to maximize brightness, ensure brightness falls within a particular range or above a particular threshold, help ensure uniformity of brightness, etc.

In some embodiments, causing the pick-up tool to press the light-emitting structure to the backplane at the determined angle may be at least partly based on movement data sensed by the touchdown sensor. As indicated herein, the touchdown sensor may comprise a plurality of pressure and/or distance sensors, which can help determine an angle at which the pick-up tool is situated, relative to the backplane. Various images of activated emitters may be captured at various angles, and the best angle (according to desired functionality) may be selected from these various angles. The touchdown sensor can help ensure the pick-up tool maintains the desired angle during LOT and/or bonding.

In some embodiments, the method 800 may additionally include functionality for determining spatial offsets, as previously indicated. For example, the method 800 may further comprise obtaining a first image indicative of a location of one or more light emitters on the light-emitting structure. The first image may be captured (e.g., from a top-view camera) from a point of view behind the transparent surface of the pick-up head, relative to the adhesive element. The method may then further comprise obtaining a second image (e.g., from a bottom-view camera) indicative of a location of one or more electrical interconnects on the light-emitting structure; and determining, based on the first image and the second image, a location of the one or more light emitters relative to the one or more electrical interconnects. In some embodiments, the method 800 may further comprise aligning the light-emitting structure to the backplane, prior to the bonding process, based at least in part on the determined location of the one or more light emitters relative to the one or more electrical interconnects. Additionally or alternatively, the method may comprise obtaining at least one image of one or more backplane contacts of the backplane and determining a location of the one or more backplane contacts of the backplane relative to the backplane. In such instances, aligning the light-emitting structure to the backplane may be further based at least in part on the determined location of the one or more backplane contacts of the backplane. Additionally or alternatively this information may be utilized to help ensure what center-to-center emitter distances and/or other tolerances are. As such, the method 800 may further comprise obtaining at least one image of a second light-emitting structure, and determining a distance between an emitter of the light-emitting structure and an emitter of the second light-emitting structure. Aligning the light-emitting structure to the backplane may then be further based at least in part on the determined distance between the emitter of the light-emitting structure and the emitter of the second light-emitting structure.

FIG. 9 is a cross-sectional view of an example LED 900, which may be incorporated into a light-emitting structure 310 as described herein, according to some embodiments. The LED 900 may be a micro-LED, which may have an active light-emitting area 906 with a linear dimension that is less than 50 μm, less than 20 μm, or less than 10 μm. For example, the linear dimension may be as small as 2 μm or 4 μm. Their small size enables a display system to have a single pixel including three micro-LEDs: a red micro-LED, a green micro-LED, and a blue micro-LED. Their small size also enables micro-LEDs to be lightweight, making them particularly suitable for use in wearable display systems, such as watches and computing glasses. Although only one LED 900 is shown in FIG. 9, a plurality of LEDs may be formed simultaneously in a light-emitting structure, as illustrated in FIG. 3B.

The LED 900 includes, among other components, a semiconductor structure. The semiconductor structure includes semiconductor layers 902 and 904 and a light-emitting layer 906 that sits between the semiconductor layers 902 and 904. For example, the LED 900 may include a semiconductor structure in which the light-emitting layer 906 is a layer of indium gallium nitride that is sandwiched between a layer of p-type gallium nitride and a layer of n-type gallium nitride. In some embodiments, semiconductor layer 902 is a p-type semiconductor, and semiconductor layer 904 is an n-type semiconductor. In some embodiments, semiconductor layer 902 is an n-type semiconductor, and semiconductor layer 904 is a p-type semiconductor.

The semiconductor layers 902 and 904 are operatively coupled to electrical contacts 908 and 910, respectively (which may correspond to electrical interconnects 316 of the light-emitting structure 310, as illustrated in FIG. 3A). The electrical contacts 908 and 910 are typically made of a conductive material, such as a metallic material. In the example of FIG. 9, the electrical contacts 908 and 910 are both located on a top surface of the semiconductor structure such that they can both support the LED 900 when it is mounted on a substrate including a control circuit. However, in some embodiments, electrical contacts can be located on opposite surfaces of a semiconductor structure.

The light-emitting layer 906 includes one or more quantum wells that output light 916 when a voltage is applied across the electrical contacts 908 and 910. To directionalize the output of light 916, the semiconductor structure may be formed into any of a variety of shapes (e.g., a paraboloid, a cylinder, or a cone) that enable collimation/quasi-collimation of light 916. Such shapes are referred to herein as "mesa" shapes; and collimation and quasi-collimation are collectively referred to herein as "collimation". Collimation results in increased brightness of light output.

In the example of FIG. 9, mesa 914 corresponds to a paraboloid shape that guides light 916 toward through a light-emitting surface 912 of the semiconductor structure. More specifically, the light-emitting layer 906 is approximately positioned at the focal point of the paraboloid such that some of the emitted light is reflected, within a critical angle of total internal reflection, off the inner walls of the paraboloid toward the light-emitting surface 912.

In some embodiments, a mesa shape also has a truncated top that can accommodate an electrical contact. In the example of FIG. 9, mesa 914 corresponds to a paraboloid shape having a truncated vertex that accommodates electrical contact 908. Base 918 refers to the part of the semiconductor structure that is not included in the mesa 914.

To enable further collimation of light 916, an optical element 920 can be formed on the light-emitting surface 912. In the example of FIG. 9, the optical element 920 is a microlens. As will be described in greater detail below, the optical element 920 can be formed from an elastomeric material or a photoresist.

Embodiments of the invention may include or be implemented in conjunction with an artificial reality system. Artificial reality is a form of reality that has been adjusted in some manner before presentation to a user, which may include, e.g., a virtual reality (VR), an augmented reality (AR), a mixed reality (MR), a hybrid reality, or some combination and/or derivatives thereof. Artificial reality content may include completely generated content or generated content combined with captured (e.g., real-world) content. The artificial reality content may include video, audio, haptic feedback, or some combination thereof, and any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, e.g., create content in an artificial reality and/or are otherwise used in (e.g., perform activities in) an artificial reality. The artificial reality system that provides the artificial reality content may be implemented on various platforms, including a head-mounted display (HMD) connected to a host computer system, a standalone HMD, a mobile device or computing system, or any other hardware platform capable of providing artificial reality content to one or more viewers.

The foregoing description of the embodiments of the disclosure has been presented for the purpose of illustration; it is not intended to be exhaustive or to limit the disclosure to the precise forms disclosed. Persons skilled in the relevant art can appreciate that many modifications and variations are possible in light of the above disclosure.

Some portions of this description describe the embodiments of the disclosure in terms of algorithms and symbolic representations of operations on information. These algorithmic descriptions and representations are commonly used by those skilled in the data processing arts to convey the substance of their work effectively to others skilled in the art. These operations, while described functionally, computationally, or logically, are understood to be implemented by computer programs or equivalent electrical circuits, microcode, or the like. Furthermore, it has also proven convenient at times to refer to these arrangements of operations as modules, without loss of generality. The described operations and their associated modules may be embodied in software, firmware, and/or hardware.

Steps, operations, or processes described may be performed or implemented with one or more hardware or software modules, alone or in combination with other devices. In some embodiments, a software module is implemented with a computer program product comprising a computer-readable medium containing computer program code, which can be executed by a computer processor for performing any or all of the steps, operations, or processes described.

Embodiments of the disclosure may also relate to an apparatus for performing the operations described. The apparatus may be specially constructed for the required purposes, and/or it may comprise a general-purpose computing device selectively activated or reconfigured by a computer program stored in the computer. Such a computer program may be stored in a non-transitory, tangible computer readable storage medium, or any type of media suitable for storing electronic instructions, which may be coupled to a computer system bus. Furthermore, any computing systems referred to in the specification may include a single processor or may be architectures employing multiple processor designs for increased computing capability.

Embodiments of the disclosure may also relate to a product that is produced by a computing process described herein. Such a product may comprise information resulting from a computing process, where the information is stored on a non-transitory, tangible computer readable storage medium and may include any embodiment of a computer program product or other data combination described herein.

The language used in the specification has been principally selected for readability and instructional purposes, and it may not have been selected to delineate or circumscribe the inventive subject matter. It is therefore intended that the scope of the disclosure be limited not by this detailed description, but rather by any claims that issue on an application based hereon. Accordingly, the disclosure of the embodiments is intended to be illustrative, but not limiting, of the scope of the disclosure, which is set forth in the following claims.

What is claimed is:

1. A display assembly system comprising:
   a pick-up head having an adhesive element disposed on a transparent surface, wherein:
      an adhesiveness of the adhesive element is sufficient to enable the adhesive element to adhere to a light-emitting structure to pick the light-emitting structure from a fabrication substrate and place the light-emitting structure onto a backplane; and
      the adhesive element is at least partially transparent;
   a pick-up tool coupled with the pick-up head and configured to position the pick-up head with 6 degrees of freedom (6DOF); and
   a touchdown sensor coupled with the pick-up tool and pick-up head and configured to sense a force applied to the pick-up head in an upward direction, substantially perpendicular to the transparent surface of the pick-up head, wherein the touchdown sensor comprises a plurality of sensors that enable the touchdown sensor to determine an angular force applied to the pick-up head.

2. The display assembly system of claim 1, wherein the pick-up head can tolerate heat of at least 150° C. without loss of function.

3. The display assembly system of claim 1, wherein the pick-up tool is configured to press the light-emitting structure to the backplane during a bonding process in which electrical contacts of the light-emitting structure are bonded to the backplane.

4. The display assembly system of claim 3, further comprising a testing assembly configured to, after the light-emitting structure is placed onto the backplane and prior to the bonding process, test electrical connectivity between the light-emitting structure and the backplane by activating light emitters of the light-emitting structure via electrical contacts on the backplane.

5. The display assembly system of claim 4, further comprising a processor and a camera, wherein the processor is configured to:
   cause the camera to capture one or more images of the activated light emitters;
   determine an angle at which the pick-up head is to press the light-emitting structure to the backplane during the bonding process, based at least in part on the one or more images; and cause the pick-up tool to press the light-emitting structure to the backplane at the determined angle during the bonding process.

6. The display assembly system of claim 5, wherein the processor is configured to cause the pick-up tool to press the light-emitting structure to the backplane at the determined angle at least partly based on movement data sensed by the touchdown sensor.

7. The display assembly system of claim 3, further comprising a rotary table configured to heat the light-emitting structure and the backplane during the bonding process.

8. The display assembly system of claim 1, further comprising a positioning tool having a substantially flat working surface and operable to move the substantially flat working surface within the plane in which the substantially flat working surface is disposed.

9. The display assembly system of claim 1, further comprising:
  a first camera configured to capture images of objects from behind the transparent surface of the pick-up head, relative to the adhesive element; and
  a second camera configured to capture images of the pick-up head from in front of the transparent surface of the pick-up head, relative to the adhesive element.

10. The display assembly system of claim 9, comprising a computer system configured to:
  obtain a first image from the first camera, the first image indicative of a location of one or more light emitters on the light-emitting structure;
  obtain a second image from the second camera, the second image indicative of a location of one or more electrical contacts on the light-emitting structure; and
  determine, based on the first image and the second image, a location of the one or more light emitters relative to the one or more electrical contacts.

11. The display assembly system of claim 10, comprising a computer system configured to align the light-emitting structure to the backplane based at least in part on the determined location of the one or more light emitters relative to the one or more electrical contacts.

12. A method of display assembly, the method comprising:
  using a pick-up head with a pick-up tool to pick a light-emitting structure from a fabrication substrate and place the light-emitting structure onto a backplane, wherein:
    the pick-up tool is configured to manipulate the pick-up head 6 degrees of freedom (6DOF);
    the pick-up head comprises an adhesive element disposed on a transparent surface;
    picking the light-emitting structure from the fabrication substrate comprises adhering the adhesive element to the light-emitting structure; and
    the adhesive element is at least partially transparent; and
  pressing the light-emitting structure to the backplane with the pick-up head during a bonding process in which electrical contacts of the light-emitting structure are bonded to the backplane, wherein a touchdown sensor coupled with the pick-up tool and pick-up head senses:
    a force applied to the pick-up head in an upward direction, substantially perpendicular to the transparent surface of the pick-up head, and
    an angular force applied to the pick-up head.

13. The method of display assembly of claim 12, further comprising, after placing the light-emitting structure onto the backplane and prior to the bonding process, testing electrical connectivity between the light-emitting structure and the backplane by activating light emitters of the light-emitting structure via electrical contacts on the backplane.

14. The method of display assembly of claim 13, further comprising:
  cause a camera to capture one or more images of the activated light emitters;
  determine an angle at which the pick-up head is to press the light-emitting structure to the backplane during the bonding process, based at least in part on the one or more images; and
  cause the pick-up tool to press the light-emitting structure to the backplane at the determined angle during the bonding process.

15. The method of display assembly of claim 14, wherein causing the pick-up tool to press the light-emitting structure to the backplane at the determined angle is at least partly based on movement data sensed by the touchdown sensor.

16. The method of display assembly of claim 12, further comprising:
  obtain a first image indicative of a location of one or more light emitters on the light-emitting structure, wherein the first image is captured from a point of view behind the transparent surface of the pick-up head, relative to the adhesive element;
  obtain a second image indicative of a location of one or more electrical interconnects on the light-emitting structure; and
  determine, based on the first image and the second image, a location of the one or more light emitters relative to the one or more electrical interconnects.

17. The method of display assembly of claim 16, further comprising aligning the light-emitting structure to the backplane, prior to the bonding process, based at least in part on the determined location of the one or more light emitters relative to the one or more electrical interconnects.

18. The method of display assembly of claim 17, further comprising:
  obtaining at least one image of one or more backplane contacts of the backplane; and
  determining a location of the one or more backplane contacts of the backplane relative to the backplane;
  wherein aligning the light-emitting structure to the backplane is further based at least in part on the determined location of the one or more backplane contacts of the backplane.

19. The method of display assembly of claim 17, further comprising:
  obtaining at least one image an of a second light-emitting structure; and
  determining a distance between an emitter of the light-emitting structure and an emitter of the second light-emitting structure;
  wherein aligning the light-emitting structure to the backplane is further based at least in part on the determined distance between the emitter of the light-emitting structure and the emitter of the second light-emitting structure.

20. A non-transitory computer-readable medium having instructions embedded thereon for assembling a display, the instructions, when executed by a computer system, cause the computer system to:
  use a pick-up head with a pick-up tool to pick a light-emitting structure from a fabrication substrate and place the light-emitting structure onto a backplane, wherein:

the pick-up tool is configured to manipulate the pick-up head 6 degrees of freedom (6DOF);

the pick-up head comprises an adhesive element disposed on a transparent surface;

picking the light-emitting structure from the fabrication substrate comprises adhering the adhesive element to the light-emitting structure; and the adhesive element is at least partially transparent; and cause the pick-up head to press the light-emitting structure to the backplane during a bonding process in which electrical contacts of the light-emitting structure are bonded to the backplane, wherein a touchdown sensor coupled with the pick-up tool and pick-up head senses:

a force applied to the pick-up head in an upward direction, substantially perpendicular to the transparent surface of the pick-up head, and an angular force applied to the pick-up head.

\* \* \* \* \*